US011223787B2

(12) United States Patent
Miyatani

(10) Patent No.: US 11,223,787 B2
(45) Date of Patent: Jan. 11, 2022

(54) INFORMATION PROCESSING APPARATUS, INFORMATION PROCESSING METHOD, AND IMAGING APPARATUS

(71) Applicant: SONY CORPORATION, Tokyo (JP)

(72) Inventor: Yoshitaka Miyatani, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/755,368

(22) PCT Filed: Oct. 19, 2018

(86) PCT No.: PCT/JP2018/038921
§ 371 (c)(1),
(2) Date: Apr. 10, 2020

(87) PCT Pub. No.: WO2019/078320
PCT Pub. Date: Apr. 25, 2019

(65) Prior Publication Data
US 2020/0314372 A1 Oct. 1, 2020

(30) Foreign Application Priority Data

Oct. 19, 2017 (JP) .............................. JP2017-202355

(51) Int. Cl.
*H04N 5/367* (2011.01)
*H04N 5/378* (2011.01)

(52) U.S. Cl.
CPC ............ *H04N 5/367* (2013.01); *H04N 5/378* (2013.01)

(58) Field of Classification Search
CPC .... H04N 5/367; H04N 5/378; H04N 5/22541; H04N 5/3696; H01L 27/14625; H01L 27/14609; H01L 27/14621
See application file for complete search history.

(56) References Cited

U.S. PATENT DOCUMENTS

2006/0256226 A1* 11/2006 Alon ...................... H04N 5/367
348/335
2009/0095912 A1* 4/2009 Slinger ............... H04N 5/2254
250/363.06
(Continued)

FOREIGN PATENT DOCUMENTS

CA 2608377 A1 11/2006
CN 1739118 A 2/2006
(Continued)

OTHER PUBLICATIONS

Asif, et al. "FlatCam: Replacing Lenses with Masks and Computation", IEEE International Conference on Computer Vision Workshop (ICCVW), Dec. 7-13, 2015, pp. 12-15.
(Continued)

*Primary Examiner* — Nhan T Tran
(74) *Attorney, Agent, or Firm* — Chip Law Group

(57) ABSTRACT

An imaging section includes a plurality of pixel output units that receive subject light that enters without going through an imaging lens and a pinhole. Output pixels of at least two of the plurality of pixel output units differ in incident angle directivity as a result of modulation of the incident angle directivity based on the incident angle of the subject light. A defective pixel detection section detects a defective pixel of the imaging section on the basis of pixel outputs of the imaging section. The defective pixel detection section discriminates a defective pixel that has produced a pixel output whose signal level is larger than or smaller than a threshold range. The image conversion section performs restoration computations by using pixel outputs generated for the respective pixels other than that of the defective pixel and a coefficient set stored in the coefficient storage section, thus generating a restored image.

18 Claims, 17 Drawing Sheets

(56) References Cited

U.S. PATENT DOCUMENTS

| | | |
|---|---|---|
| 2010/0141807 A1 | 6/2010 | Alon et al. |
| 2011/0174998 A1 | 7/2011 | Molnar et al. |
| 2014/0055646 A1* | 2/2014 | Kobayashi ............. H04N 5/367 348/246 |
| 2014/0184861 A1 | 7/2014 | Georgiev et al. |
| 2014/0253781 A1 | 9/2014 | Gill et al. |
| 2016/0126275 A1 | 5/2016 | Kurokawa |
| 2018/0213172 A1* | 7/2018 | Ohtsubo ............. H04N 5/36961 |
| 2018/0322635 A1* | 11/2018 | Guo ..................... G06K 9/3233 |
| 2018/0329185 A1* | 11/2018 | Gill ...................... H04N 5/2254 |
| 2019/0313018 A1* | 10/2019 | Ono ................... H04N 5/22541 |

FOREIGN PATENT DOCUMENTS

| | | |
|---|---|---|
| CN | 101228460 A | 7/2008 |
| CN | 101814182 A | 8/2010 |
| CN | 101819325 A | 9/2010 |
| CN | 105008969 A | 10/2015 |
| JP | 4377404 B2 | 12/2009 |
| JP | 5334574 B2 | 11/2013 |
| JP | 2016-510910 A | 4/2016 |
| JP | 2016-092413 A | 5/2016 |
| KR | 10-2008-0021040 A | 3/2008 |
| WO | 2004/063989 A2 | 7/2004 |
| WO | 2006/125975 A1 | 11/2006 |
| WO | 2014/137922 A1 | 9/2014 |
| WO | 2016/123529 A1 | 8/2016 |
| WO | 2017/095587 A1 | 6/2017 |
| WO | WO-2017095587 A1 * | 6/2017 ........... H04N 5/2254 |
| WO | 2018/123318 A1 | 7/2018 |

OTHER PUBLICATIONS

Extended European Search Report of EP Application No. 18867590.4, dated Nov. 17, 2020, 08 pages of EESR.

Asif, et al. "FlatCam: Replacing Lenses with Masks and Computation", IEEE International Conference on Computer Vision Workshop (ICCVW), Dec. 7-13, 2015, pp. 663-666.

International Search Report and Written Opinion of PCT Application No. PCT/JP2018/038921, dated Jan. 8, 2019, 07 pages of ISRWO.

Asif, et al., "FlatCam: Replacing Lenses with Masks and Computation", IEEE, International Conference on Computer Vision Workshop (ICCVW), 2015, 04 pages.

\* cited by examiner

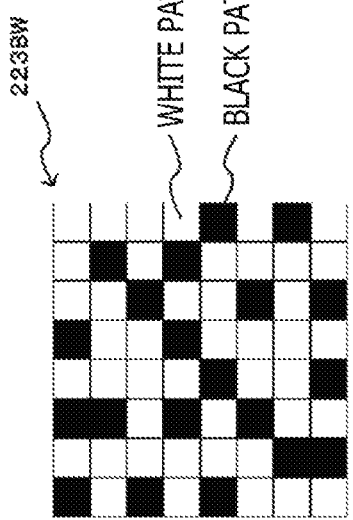
FIG. 9A
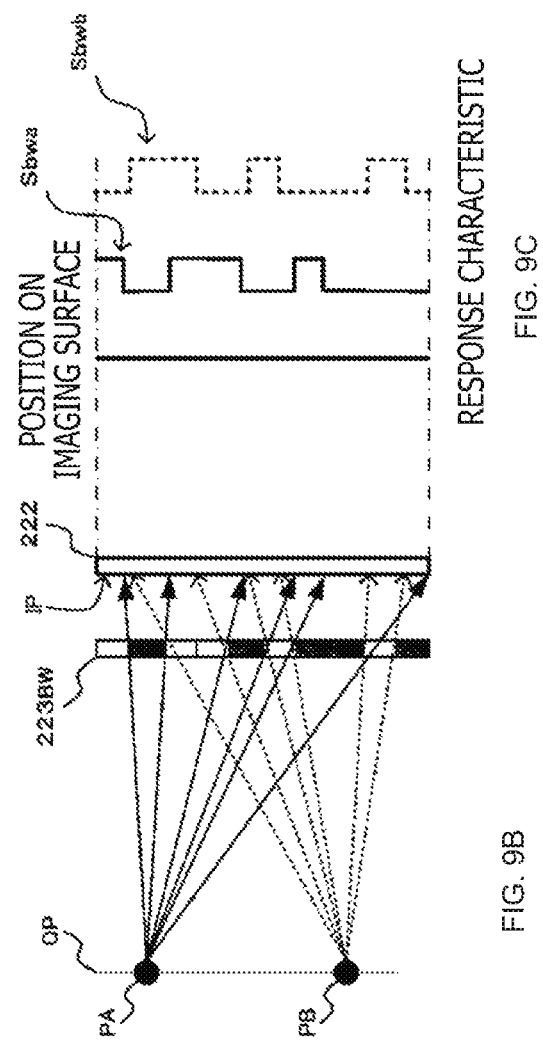
FIG. 9B
FIG. 9C

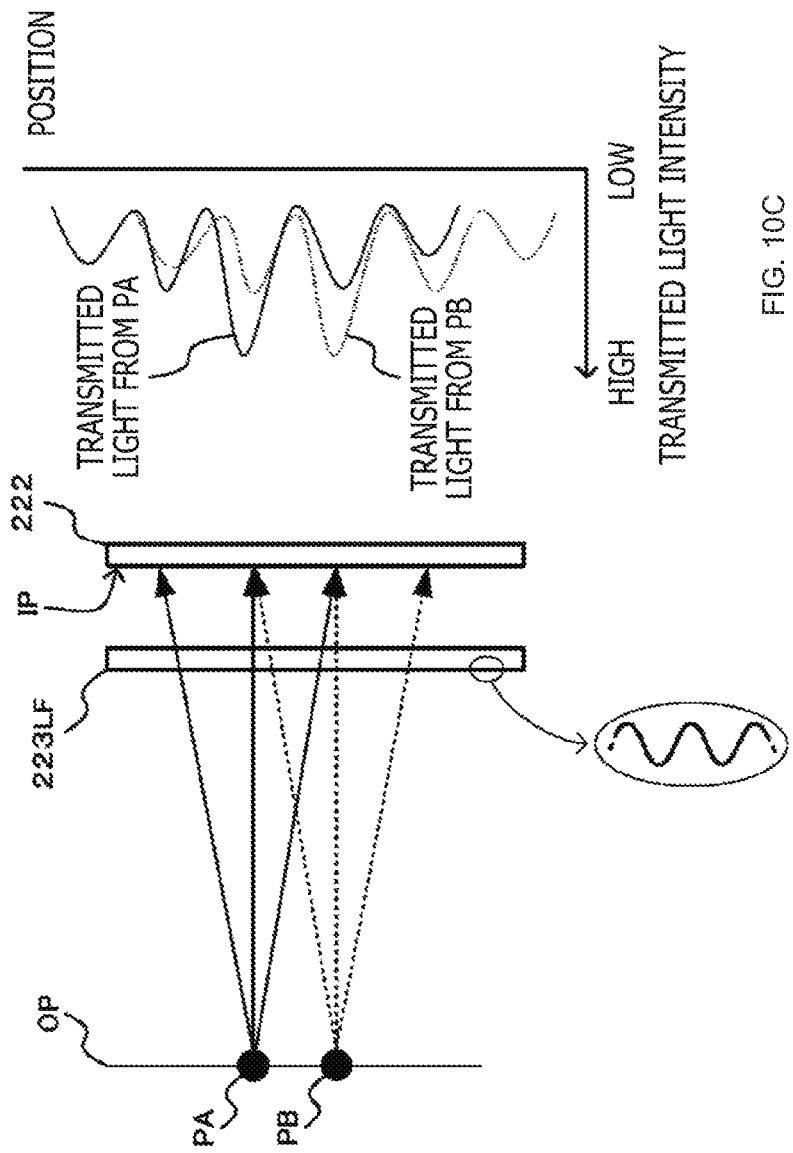

INFORMATION PROCESSING APPARATUS, INFORMATION PROCESSING METHOD, AND IMAGING APPARATUS

CROSS REFERENCE TO RELATED APPLICATIONS

This application is a U.S. National Phase of International Patent Application No. PCT/JP2018/038921 filed on Oct. 19, 2018, which claims priority benefit of Japanese Patent Application No. JP 2017-202355 filed in the Japan Patent Office on Oct. 19, 2017. Each of the above-referenced applications is hereby incorporated herein by reference in its entirety.

TECHNICAL FIELD

The present disclosure relates to an information processing apparatus, an information processing method, an imaging apparatus, and a program and allows for highly accurate restoration of a captured image from pixel output information generated in accordance with subject light that enters without going through an imaging lens and a pinhole.

BACKGROUND ART

Two configurations of an imaging apparatus are well known, one which includes a combination of an imaging lens and an imaging device and another which includes a combination of a pinhole and an imaging device.

The configuration including a combination of an imaging lens and an imaging device is employed by a majority of imaging apparatuses available today. The imaging lens concentrates light from a subject, thus forming a subject light image on an imaging surface of the imaging device and allowing the imaging device to generate an image signal proportional to the subject light image. As described above, an imaging apparatus including a combination of an imaging lens and an imaging device is affected by aberration of the imaging lens and has its limitations in downscaling because the imaging lens is an essential building block.

On the other hand, in the configuration including a pinhole and an imaging device, only a small amount of light reaches the imaging surface of the imaging device because of its lack of an imaging lens for concentrating light from the subject, making it necessary to lengthen an exposure time, increase a gain, or perform other process. As a result, the configuration cannot endure general use and is particularly unfit for high-speed imaging.

For example, therefore, PTL 1 proposes an imaging apparatus that includes a combination of a filter including a diffraction grating and an imaging device. The imaging apparatus captures an image of light from a subject as a pattern acquired via the filter including the diffraction grating, reproducing a subject image through a computation process using the imaging result pattern. Also, an imaging device having no imaging lens is proposed in PTL 2 and NPL 1.

CITATION LIST

Patent Literature

[PTL 1]
PCT Patent Publication No. WO 2016/123529
[PTL 2]
National Publication of International Patent Application No. 2016-510910

Non-Patent Literature

[NPL 1]
M. Salman Asif and four others, "Flatcam: Replacing lenses with masks and computation," "2015 IEEE International Conference on Computer Vision Workshop (ICCVW)," 2015, pp. 663-666

SUMMARY

Technical Problem

Incidentally, an imaging apparatus as described above having no imaging lens does not generate an image signal through photoelectric conversion of a subject light image formed on the imaging surface and, instead, generates different information from that generated by an imaging apparatus including an imaging lens and an imaging device.

In light of the foregoing, it is an object of the present technology to provide an information processing apparatus, an information processing method, an imaging apparatus, and a program that allow for highly accurate restoration of a captured image from pixel output information generated in accordance with subject light that enters without going through an imaging lens and pinhole.

Solution to Problem

A first aspect of the present technology is an information processing apparatus that includes an image conversion section. The image conversion section generates a restored image by using pixel outputs other than that of a defective pixel output unit. The pixel outputs are produced by an imaging device that includes a plurality of pixel output units that receive subject light that enters without going through an imaging lens and a pinhole. The pixel outputs of at least two of the plurality of pixel output units differ in incident angle directivity as a result of modulation of the incident angle directivity in accordance with the incident angle of the subject light.

In the present technology, the image conversion section generates a restored image that, for example, permits visual recognition of a subject through restoration computations by using, of the plurality of pixel outputs produced by the imaging device, the pixel outputs other than that of a defective pixel output unit. In the imaging device, of the plurality of pixel output units that receive subject light that enters without going through an imaging lens and a pinhole, the pixel outputs of at least two of the plurality of pixel output units differ in incident angle directivity as a result of modulation of the incident angle directivity in accordance with the incident angle of the subject light. In the restoration computations, a restored image is generated, for example, by solving simultaneous equations using the pixel outputs of the plurality of pixel output units other than that of the defective pixel output unit and coefficients of a group of coefficient sets that have been changed in accordance with the defective pixel output unit.

A defective pixel detection section for detecting a defective pixel output unit detects a defective pixel output unit by using pixel outputs generated by respective pixels of the imaging device. For example, the defective pixel detection section sets a threshold range on the basis of statistics of pixel output signal levels and discriminates, as a defective pixel output unit, a pixel output unit that has produced a pixel output whose signal level is larger than an upper limit of the threshold range or smaller than a lower limit thereof. Also, a threshold range may be set on the basis of statistics other than that of the pixel output generated by the defective pixel output unit that has already been detected.

In the imaging device, at least two of the plurality of pixel output units differ in incident angle directivity that indicates the directivity relative to the incident angle of incident light from the subject. For example, each of the plurality of pixel output units includes a photodiode, and at least the two pixel output units each have a light-shielding film for shielding subject light from entering the photodiode such that a zone over which subject light is shielded by the light-shielding film is different between at least the two pixel output units. Also, each of the plurality of pixel output units may include a plurality of photodiodes such that at least the two pixel output units differ in incidence position of incident light from the subject for the plurality of photodiodes.

A second aspect of the present technology is an information processing method that includes generation of a restored image by using pixel outputs other than that of a defective pixel output unit. The pixel outputs are produced by an imaging device that includes the plurality of pixel output units that receive subject light that enters without going through an imaging lens and a pinhole. The pixel outputs of at least two of the plurality of pixel output units differ in incident angle directivity as a result of modulation of the incident angle directivity in accordance with the incident angle of the subject light.

A third aspect of the present technology is an imaging apparatus that includes an imaging section, a defective pixel information storage section, and an image conversion section. The imaging section uses an imaging device that includes the plurality of pixel output units that receive subject light that enters without going through an imaging lens and a pinhole. The pixel outputs of at least two of the plurality of pixel output units differ in incident angle directivity as a result of modulation of the incident angle directivity in accordance with the incident angle of the subject light.

The defective pixel information storage section stores defective pixel information that indicates, of the plurality of pixel outputs produced by the imaging section, the defective pixel output unit.

The image conversion section generates a restored image by using, of the plurality of pixel outputs produced by the imaging section, the pixel outputs other than that of a defective pixel output unit on the basis of the defective pixel information stored in the defective pixel information storage section.

In the present technology, the imaging section includes a plurality of pixel output units that receive subject light that enters without going through an imaging lens and a pinhole. Output pixels of at least two of the plurality of pixel output units differ in incident angle directivity as a result of modulation of the incident angle directivity in accordance with the incident angle of the subject light. Also, for example, a threshold range is set to cover a preset range, or a threshold range is set in accordance with the pixel output during live view operation such that a pixel output unit that has produced a pixel output whose signal level is larger than or smaller than the threshold range is discriminated a defective pixel output unit. The defective pixel information storage section updates the defective pixel information stored therein on the basis of defective pixel detection results. The image conversion section generates a restored image by using pixel outputs other than that of a defective pixel output unit on the basis of the defective pixel information stored in the defective pixel information storage section.

A fourth aspect of the present technology is a program that causes a computer to perform image processing. The program causes the computer to perform a procedure for generating a restored image by using pixel outputs other than that of a defective pixel output unit. The pixel outputs are produced by an imaging device that includes the plurality of pixel output units that receive subject light that enters without going through an imaging lens and a pinhole. The pixel outputs of at least two of the plurality of pixel output units differ in incident angle directivity as a result of modulation of the incident angle directivity in accordance with the incident angle of the subject light.

Advantageous Effects of Invention

The present technology generates a restored image by using pixel outputs other than that of a defective pixel output unit. The pixel outputs are produced by an imaging device that includes the plurality of pixel output units that receive subject light that enters without going through an imaging lens and a pinhole. The pixel outputs of at least two of the plurality of pixel output units differ in incident angle directivity as a result of modulation of the incident angle directivity in accordance with the incident angle of the subject light. This makes it possible to highly accurately restore a captured image on the basis of subject light that enters without going through an imaging lens and pinhole. It should be noted that the effects recited in the present specification are merely illustrative and not restrictive, and there may be additional effects.

BRIEF DESCRIPTION OF DRAWINGS

FIGS. 9A, 9B, and 9C illustrate diagrams illustrating a case where a black-and-white pattern mask is used.

FIGS. 10A, 10B, and 10C illustrate diagrams illustrating a case where a light interference mask is used.

DESCRIPTION OF EMBODIMENT

A description will be given below of a mode for carrying out the present technology. It should be noted that the description will be given in the following order.

1. Overview of Imaging
2. Configuration of Imaging Section
3. Other Configuration of Imaging Section
4. Configuration and Operation of Information Processing Apparatus
5. Configuration and Operation of Imaging Apparatus <1. Overview of Imaging>

All subjects can be considered sets of point light sources, with light emitted in all directions. Therefore, a principle of imaging can be explained by thinking about how to capture images of light originating from the light sources.

Figure 1:
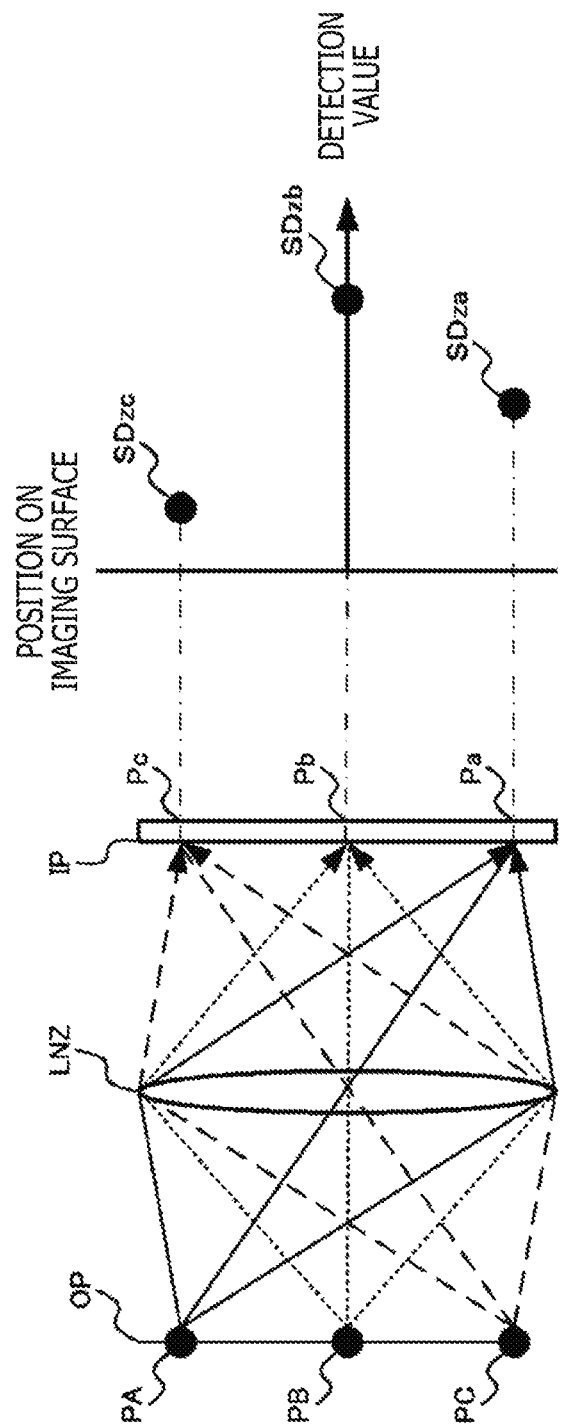
FIGS. 1A and 1B illustrate diagrams for describing a principle of imaging in a case where an imaging lens is used.

FIGS. 1A and 1B illustrate diagrams for describing the principle of imaging in a case where an imaging lens is used. As illustrated in FIG. 1A, for example, there are subjects on a subject plane OP that are denoted as light sources PA, PB, and PC. Light beams emitted from the point light source PA are concentrated at a position Pa of an imaging surface IP. It should be noted that an imaging lens LNZ is a lens with a light concentration function to allow subject light entering from the same direction to enter pixels adjacent to each other. Similarly, light beams emitted from the point light source PB (PC) are concentrated by the imaging lens LNZ at a position Pb (Pc) of the imaging surface IP. A pixel output proportional to the intensity of the light beams from the point light source PA is acquired from the device at the position Pa. Similarly, a pixel output proportional to the intensity of the light beams from the point light source PB (PC) is acquired from the device at the position Pb (Pc). This makes it possible to generate a pixel signal of a captured image representing the point light sources PA, PB, and PC of the subject plane OP by using the respective pixel outputs. It should be noted that, in FIG. 1B, the vertical axis represents positions on the imaging surface IP and that the horizontal axis represents detection values based on the light intensities of the imaging devices at the respective positions. For example, the detection values at the positions Pa, Pb, and Pc are SDza, SDzb, and SDzc, respectively, and a case is illustrated in which SDza>SDzb>SDzc.

Figure 2:
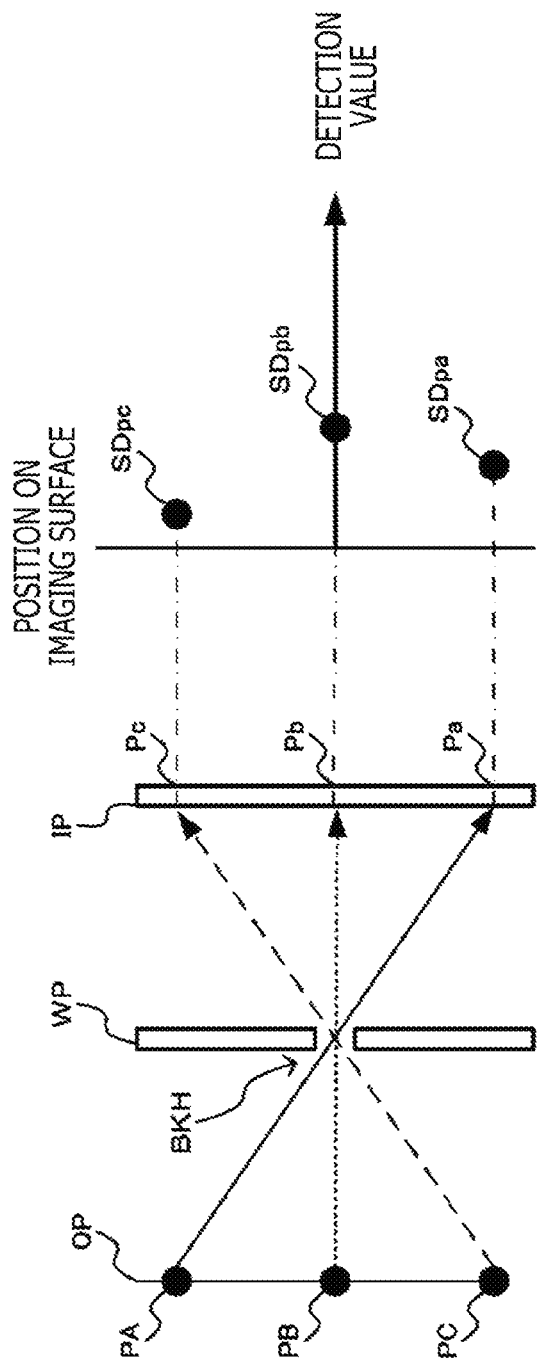
FIGS. 2A and 2B illustrate diagrams for describing a principle of imaging in a case where a pinhole is used.

FIGS. 2A and 2B illustrate diagrams for describing a principle of imaging in a case where a pinhole is used. In a case of a pinhole, the relationship between the respective pixel positions and the light incident angle is uniquely determined. As illustrated in FIG. 2A, for example, there are subjects on the subject plane OP that are denoted as the light sources PA, PB, and PC. Light beams emitted from the point light source PA pass through a hole portion BKH of a light-shielding wall WP and is illuminated at the position Pa of the imaging surface IP. Similarly, light beams emitted from the point light source PB (PC) pass through the hole portion BKH and is illuminated at the position Pb (Pc) of the imaging surface IP. A pixel output proportional to the intensity of the light beams from the point light source PA that have passed through the hole portion BKH is acquired from the device at the position Pa. Similarly, a pixel output proportional to the intensity of the light beams from the point light source PB (PC) that have passed through the hole portion BKH is acquired from the device at the position Pb (Pc). This makes it possible to generate a pixel signal of a captured image representing the point light sources PA, PB, and PC of the subject plane OP by using the respective pixel outputs. It should be noted that, in FIG. 2B, the vertical axis represents positions on the imaging surface IP and that the horizontal axis represents detection values based on the light intensities of the imaging devices at the respective positions. For example, the detection values at the positions Pa, Pb, and Pc are SDpa, SDpb, and SDpc, respectively, and a case is illustrated in which SDpa>SDpb>SDpc. Also, pixel outputs are generated only by light beams that have passed through the hole portion BKH, causing the detection values to be smaller than in a case where an imaging lens is used. That is, the following relationship results "SDza>SDpa, SDzb>SDpb, SDzc>SDpc." It should be noted that in a case of a configuration using a pinhole, the relationship between the respective pixel positions in the imaging device and the light incident angle is uniquely determined. In a case of a configuration using a pinhole and a conventional imaging device or schemes employed by other companies illustrated in prior art documents, therefore, it is impossible to specify the directivity independently for each pixel output unit. Further, an imaging apparatus including a pinhole and an imaging device requires no imaging lens, thus leaving room for possible downsizing of the apparatus configuration as compared to an imaging apparatus including an imaging lens and an imaging device. However, the captured image does not have sufficient brightness, making it essential to lengthen the exposure time so as to allow capture of an image that is bright to a certain extent, increase the gain, or perform other action. As a result, blur is likelier to occur during imaging of a fast object, or natural color representation may not be achieved.

Figure 3:
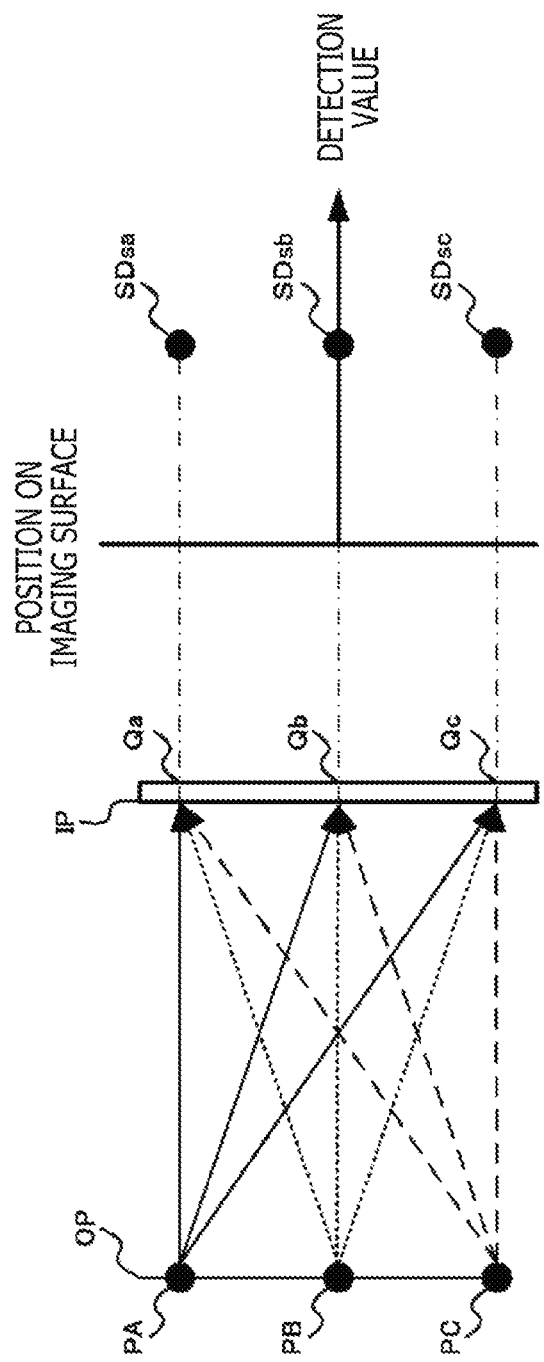
FIGS. 3A and 3B illustrate diagrams for describing a case where an imaging lens or a pinhole is not provided.

FIGS. 3A and 3B illustrate diagrams for describing a case where an ordinary imaging device is used in a lensless configuration with no imaging lens or pinhole provided therein. As illustrated in FIG. 3A, light beams emitted from the point light sources PA, PB, and PC are incident at positions Qa, Qb, and Qc, respectively. Also, in FIG. 3B, the vertical axis represents positions on the imaging surface IP, and the horizontal axis represents detection values based on the light intensities of the imaging devices at the respective positions. The pixel outputs of the respective devices at the positions Qa, Qb, and Qc are proportional to the intensities of the light beams from the point light sources PA, PB, and PC. For example, the detection values at the positions Qa, Qb, and Qc are SDsa, SDsb, and SDsc, respectively, with the following relationship "SDsa≈SDsb≈SDsc." This makes it possible to generate a pixel signal of a captured image representing the point light sources PA, PB, and PC of the subject plane OP by using the respective pixel outputs.

For this reason, the imaging section of the present technology uses an imaging device that includes a plurality of pixel output units that receive subject light that enters without going through an imaging lens and a pinhole. The pixel outputs of at least two of the plurality of pixel output units differ in incident angle directivity as a result of modulation of the incident angle directivity in accordance with the incident angle of subject light. The term "characteristic of differing in incident angle directivity relative to subject light" here refers to the fact that a light reception sensitivity characteristic varies depending on the incident angle of incident light for the image output unit. It should be noted that what kind of unit a pixel output unit is will become apparent from the description given later.

<2. Configuration of Imaging Section>

A description will be given next of the imaging section that generates pixel output information processed by the information processing apparatus of the present technology. The imaging section includes an imaging device that includes a plurality of pixel output units that receive subject light that enters without going through an imaging lens and a pinhole. Output pixels of at least two of the plurality of pixel output units differ in incident angle directivity as a result of modulation of the incident angle directivity in accordance with the incident angle of the subject light. The imaging device acquires pixel output of an image that includes pixel outputs of the respective positions of the pixel output units. In other words, the imaging section generates a pixel output for each pixel output unit by a difference in incident angle directivity of the pixel output values (pixel outputs) of at least two of the plurality of pixel output units for subject light that has entered without going through a light concentration function to allow subject light entering from the same direction to enter pixels adjacent to each other. That is, the imaging section generates a pixel output for each pixel output unit by an imaging device having no imaging lens. A description will be given below of a case where the imaging section generates pixel output information proportional to subject light.

Figure 4:
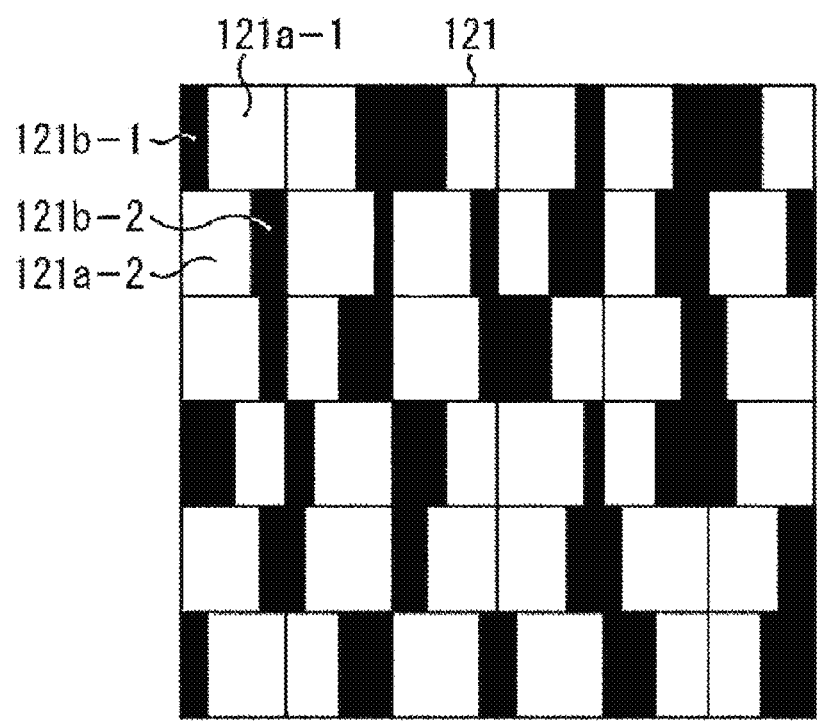
FIG. 4 illustrates a diagram illustrating a configuration of an imaging section.

FIG. 4 illustrates a diagram illustrating a configuration of an imaging section that generates pixel output information processed by the information processing apparatus of the present technology. It should be noted that FIG. 4 illustrates, for example, as part of the region of the imaging section, a region having six horizontal pixels×six vertical pixels, respectively.

An imaging section 121 is provided, for each of pixels 121a of the imaging device (pixel output units), as part of a light-receiving region of a photodiode and as a zone having a different light-shielding film 121b, a modulation device, from one pixel 121a to another, allowing incident light entering each of the pixels 121a to be optically modulated in accordance with the incident angle. That is, the imaging section 121 is configured in such a manner as to have a different light reception sensitivity proportional to the incident angle of incident light from one pixel (pixel output unit) to another, providing a directivity relative to an incident direction, i.e., incident angle directivity. Therefore, provision of the light-shielding film 121b over a different zone from one pixel 121a to another ensures that the light reception sensitivity relative to the incident angle of incident light varies from one pixel 121a to another, thus providing each of the pixels 121a with a different incident angle directivity.

For example, pixels 121a-1 and 121a-2 differ in zone over which light is shielded by light-shielding films 121b-1 and 121b-2 provided from entering the pixels (differ in at least one of region (position) in which light is shielded and area over which light is shielded). That is, in the pixel 121a-1, the light-shielding film 121b-1 is provided in such a manner as to shield light on part of the left side of the light reception region of the photodiode by only a given width. In the pixel 121a-2, the light-shielding film 121b-2 is provided in such a manner as to shield light on part of the right side of the light reception region by a horizontally greater width than in the light-shielding film 121b-1. Also, in other pixels 121a, the light-shielding films 121b are similarly provided and randomly arranged in a pixel array in such a manner as to shield light over a different zone in the light reception region from one pixel to another. This imaging device is configured to permit independent setting (design) of the width and position of the light-shielding film for each of the pixels 121a, thus making it possible to independently set an incident angle directivity for each of the pixels 121a. As a result, it is possible to independently set, as an output pixel value, an incident angle directivity for each of the pixels 121a.

It should be noted that the larger the ratio of coverage of the light reception region of each pixel with the light-shielding film 121b, the smaller the amount of light received. Therefore, it is preferred that the light-shielding film 121b should have an area that permits a given amount of light to be received. Also, there is no need to provide a light-shielding film in each of all the pixels 121a of the imaging device.

Figure 5A:
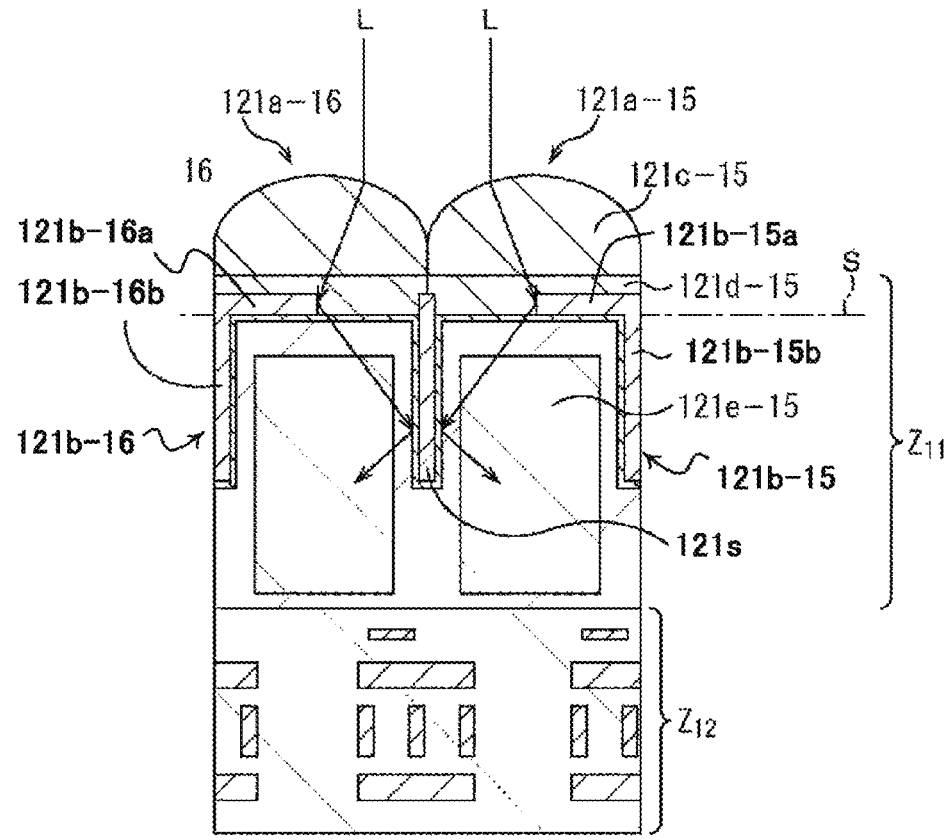
FIGS. 5A and 5B illustrate diagrams illustrating a configuration example of an imaging section 121.
Figure 5B:
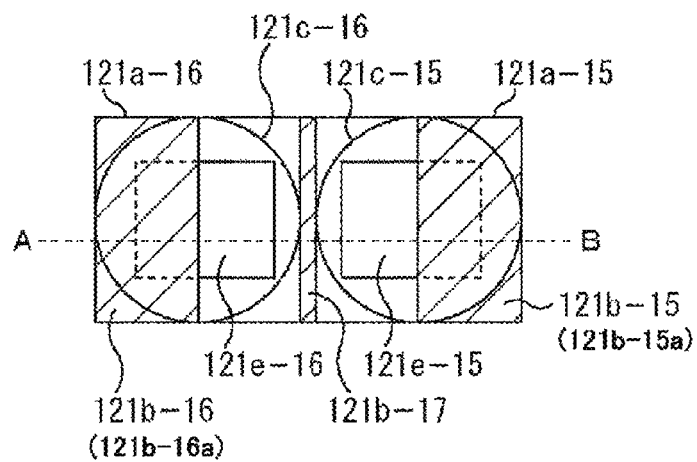

A description will be given next of a configuration of the imaging section. FIGS. 5A and 5B illustrate a configuration example of the imaging section 121. FIG. 5A is a side sectional view of the imaging section 121, and FIG. 5B is a top view in the configuration example of the imaging section 121. It should be noted that the side sectional view in FIG. 5A is a section along A-B in FIG. 5B.

In the imaging section 121, incident light L is downwardly incident from top to bottom in the figure. An interconnect layer Z12 is provided in each of pixels 121a-15 and 121a-16 adjacent to each other in the figure, with a photoelectric conversion layer Z11 provided on top thereof, thus providing a so-called back-illuminated configuration.

It should be noted that in a case where there is no need to distinguish between the pixels 121a-15 and 121a-16, these pixels will be simply referred to as the pixels 121a and that other components will be similarly referred to. Also, although FIGS. 5A and 5B illustrate a side view and a top view of two pixels included in the pixel array of the imaging section 121, it is needless to say that more pixels 121a than these are provided therein which are not illustrated.

Further, the pixels 121a-15 and 121a-16 include photodiodes 121e-15 and 121e-16 in the photoelectric conversion layer Z11, respectively. Also, on-chip lenses 121c-15 and 121c-16 and color filters 121d-15 and 121d-16 in the order from the top are formed on top of the photodiodes 121e-15 and 121e-16.

The on-chip lenses are provided, one for each pixel output unit, and have a function to concentrate subject light incident on the on-chip lenses only onto the corresponding pixel output units. For example, the on-chip lenses 121c-15 and 121c-16 concentrate incident light onto the photodiodes 121e-15 and 121e-16.

The color filters 121d-15 and 121d-16 are filters that transmit specific wavelengths of light such as red, green, blue, and infrared. Also, the color filters 121d-15 and 121d-16 may be transparent. Alternatively, there may be no color filters.

At the pixel boundary in the photoelectric conversion layer Z11 of the pixels 121a-15 and 121a-16, light-shielding films 121b-15 and 121b-16 and a device separation film 121s are formed. The light-shielding films 121b-15 and 121b-16 are in the shape of the letter L as seen from the side as illustrated in FIG. 5A and have incident light shielding sections 121b-15a and 121b-16a provided on a filter surface side and separation sections 121b-15b and 121b-16b formed perpendicularly relative to the filter surface. Also, as illustrated in FIG. 5B, the incident light shielding sections of the light-shielding films 121b-15 and 121b-16 shield light from a light-receiving surface S as seen from above. On the light-receiving surface S of the photodiodes 121e-15 and 121e-16 of the pixels 121a-15 and 121a-16, the incident light shielding sections 121b-15a and 121b-16a of the light-shielding films 121*b*-15 and 121*b*-16 shield light over different zones, respectively. As a result, a different incident angle directivity is set for each pixel (pixel output unit). It should be noted, however, that the zone to be shielded from light is not limited to being different from one pixel 121*a* to another in the imaging section 121 and that the same zone may be shielded from light in some of the pixels 121*a*.

Also, the device separation film 121*s* is provided to be opposed to the separation sections 121*b*-15*b* and 121*b*-16*b* of the light-shielding films 121*b*-15 and 121*b*-16, and crosstalk between the adjacent pixels such as crosstalk of the incident light L between the adjacent pixels in FIG. 5A is suppressed by the separation sections of the light-shielding films 121*b*-15 and 121*b*-16 and the device separation film 121*s*.

The light-shielding films 121*b*-15 and 121*b*-16 and the device separation film 121*s* include metals such as an alloy of tungsten (W) and aluminum (Al) or aluminum (Al) and copper (Cu). Also, the light-shielding films 121*b*-15 and 121*b*-16 and the device separation film 121*s* may be formed by the same process as for forming interconnects in the semiconductor process and by using the same metal as for interconnects at the same time. Further, the light-shielding films 121*b*-15 and 121*b*-16 and the device separation film 121*s* may not be identical in thickness from one position to another. It should be noted that one pixel corresponds to a pixel output unit in the examples illustrated in FIGS. 4, 5A and 5B.

Figure 6A:
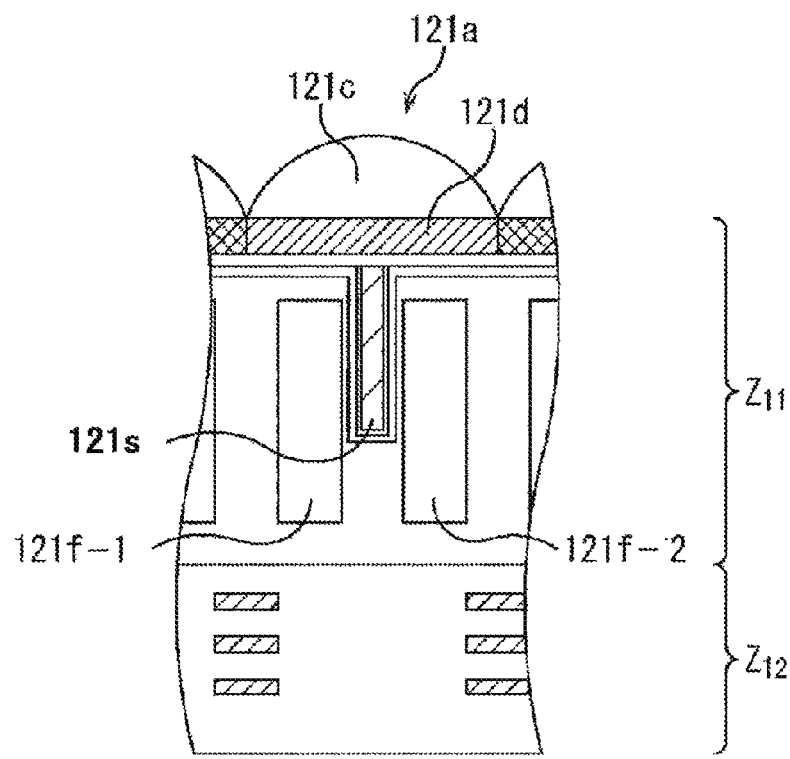
FIGS. 6A and 6B illustrate diagrams illustrating a second configuration example of the imaging section 121.
Figure 6B:
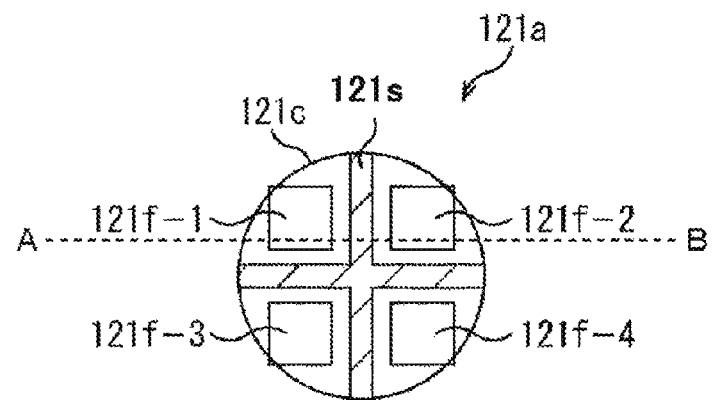

FIGS. 6A and 6B illustrate diagrams illustrating a second configuration example of the imaging section 121. FIG. 6A illustrates a side sectional view of the pixel 121*a* of the imaging section 121, a second configuration example, and FIG. 6B illustrates a top view of the imaging section 121. Also, the side sectional view in FIG. 6A is a section along A-B in FIG. 5B.

As illustrated in FIGS. 6A and 6B, the imaging section 121 differs from the imaging section 121 illustrated in FIGS. 5A and 5B in that four photodiodes 121*f*-1 to 121*f*-4 are formed in the pixel 121*a* and that the device separation film 121*s* is formed in a region where the photodiodes 121*f*-1 to 121*f*-4 are separated from one another. That is, in the imaging section 121 illustrated in FIGS. 6A and 6B, the device separation film 121*s* is formed in the shape of a plus sign as seen from above. The intersecting point of bars of the plus sign may be located at the center of the pixel 121*a* as illustrated in FIGS. 6A and 6B to ensure that the light-receiving surfaces of the four photodiodes are identical in size. Alternatively, the intersecting point may be moved from the center of the pixel 121*a* so that the pixel 121*a* has the photodiodes whose light-receiving surfaces differ in size. That is, the imaging section 121 may have image output units having different characteristics, with the intersecting point located at the center in some of the pixels 121*a* and the intersecting point moved from the center in the other pixels 121*a*. It should be noted that these common components will be denoted by the same reference numerals and the description thereof will be omitted.

The imaging section 121 configured as illustrated in FIGS. 6A and 6B can prevent electrical and optical crosstalk between the photodiodes 121*f*-1 to 121*f*-4 by separating the photodiodes 121*f*-1 to 121*f*-4 with the device separation film 121*s*.

That is, in the imaging section illustrated in FIGS. 5A and 5B, a photodiode is provided for each pixel output unit so that the light-shielding state by the light-shielding film 121*b* of each pixel (pixel output unit) varies from one pixel to another, thus providing each of the pixels with a different incident angle directivity. It should be noted that one pixel corresponds to a pixel output unit in the imaging section illustrated in FIGS. 5A and 5B. Also, in the imaging section illustrated in FIGS. 6A and 6B, four photodiodes are provided for each pixel output unit. It is possible to independently provide each pixel output unit with a different incident angle directivity (set a different incident angle directivity for each pixel output unit) by varying, of the four photodiodes, those contributing to the output pixel unit from one pixel output unit to another. For example, generating output pixel information by adding signals acquired from the photodiodes 121*f*-1 and 121*f*-2 provides output pixel information having a horizontal incident angle directivity, and generating output pixel information by adding signals acquired from the photodiodes 121*f*-1 and 121*f*-3 provides output pixel information having a vertical incident angle directivity.

It should be noted that whether or not a contribution is made can be realized, for example, by whether or not to read out the detection value of each photodiode into a floating diffusion or resetting the detection values (charge) accumulated in the photodiodes before readout into the floating diffusion by using an electronic shutter function. Also, in a case where an electronic shutter function is used, it is possible to assume, by performing a reset immediately before reading out the charge generated by the photodiode 121*f* into the floating diffusion, that the photodiode 121*f* makes no contribution to the output pixel unit. It is also possible to make a partial contribution by providing a time interval between the reset and the readout into the floating diffusion. It should be noted that the imaging section illustrated in FIGS. 6A and 6B acquires a single output pixel value from the four photodiodes. Therefore, the four photodiodes are included in a single pixel output unit.

Figures 7A, 7B:
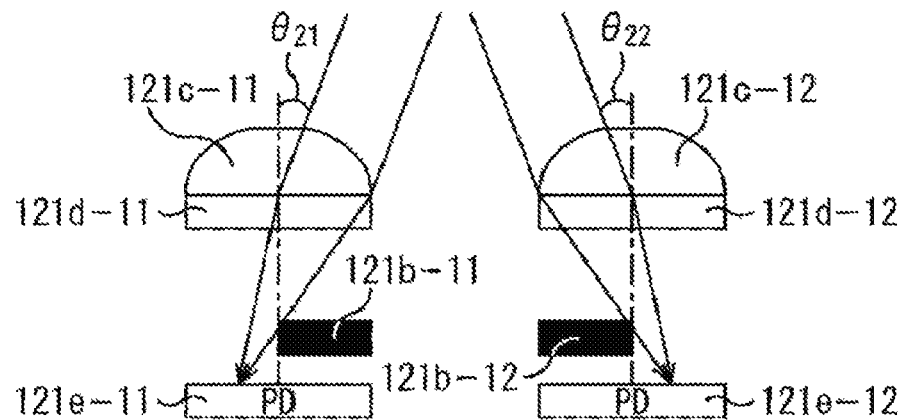
FIGS. 7A, 7B, and 7C illustrate diagrams for describing incident angle directivity.
Figure 7C:
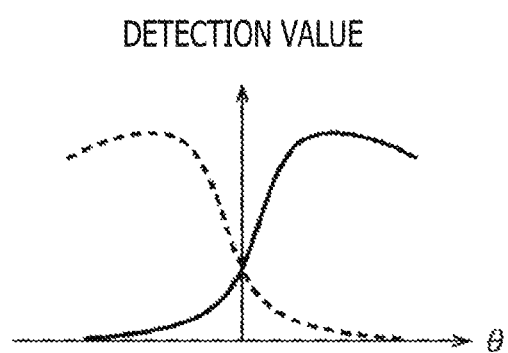

A description will be given next of the incident angle directivity. FIGS. 7A, 7B and 7C illustrate diagrams for describing the incident angle directivity of the pixel output unit in the imaging section 121. In FIGS. 7A and 7B, an on-chip lens 121*c*-11 (121*c*-12), a color filter 121*d*-11 (121*d*-12), and a photodiode 121*e*-11 (121*e*-12) are stacked in this order. The on-chip lens 121*c*-11 (121*c*-12) concentrates incident light entering from incident directions from above. The color filter 121*d*-11 (121*d*-12) passes light of a given wavelength. The photodiode 121*e*-11 (121*e*-12) generates a pixel signal through photoelectric conversion.

It should be noted that in a case where there is no need to distinguish between the on-chip lenses 121*c*-11 and 121*c*-12, the color filters 121*d*-11 and 121*d*-12, and the photodiodes 121*e*-11 and 121*e*-12, these components will be simply referred to as the on-chip lens 121*c*, the color filter 121*d*, and the photodiode 121*e*.

A light-shielding film 121*b*-11 (121*b*-12) is provided in the imaging section 121 to shield light from part of the region that receives incident light. The light-shielding film 121*b*-11 (121*b*-12) includes, for example, a metal interconnect.

In a case where the light-shielding film 121*b*-11 is provided to shield the right half side of the photodiode 121*e*-11 from light as illustrated in FIG. 7A, the detection value of the photodiode 121*e*-11 changes with change in an incident angle FIGS. 7A, 7B, and 7C of incident light as depicted by a solid line waveform. It should be noted that, in FIG. 7C, the horizontal axis is the incident angle θ and that the vertical axis represents the detection value of the photodiode 121*e*.

That is, the larger the incident angle θ (the more the incident direction is located toward the right side in the figure), the larger the detection value of the photodiode 121*e*-11 becomes because of entry of light into the zone having no light-shielding film 121*b*-11. Conversely, the smaller the incident angle θ (the more the incident direction is located toward the left side in the figure), the smaller the detection value of the photodiode 121*e*-11 becomes because of entry of light into the zone having the light-shielding film 121*b*-11.

Also, in a case where the light-shielding film 121*b*-12 is provided to shield the right half side of the photodiode 121*e*-12 from light as illustrated in FIG. 7B, the detection value of the photodiode 121*e*-12 changes with change in the incident angle θ of incident light as depicted by a dotted line waveform.

That is, the larger the incident angle θ (the more the incident direction is located toward the right side in the figure), the smaller the detection value of the photodiode 121*e*-12 becomes because of entry of light into the zone having the light-shielding film 121*b*-12. Conversely, the smaller the incident angle θ (the more the incident direction is located toward the left side in the figure), the larger the detection value of the photodiode 121*e*-12 becomes because of entry of light into the zone having no light-shielding film 121*b*-12.

The waveforms representing the changes in detection value with change in the incident angle θ illustrated in FIG. 7C can be varied in accordance with the zones covered by the light-shielding films 121*b*-11 and 121*b*-12, thus making it possible to provide each pixel output unit with a different incident angle directivity. The term "incident angle directivity" here refers to the characteristic that the detection value of each pixel output unit changes with change in the incident angle θ. However, it can also be said that the term means the characteristic that the light-shielding level changes with change in the incident angle θ. That is, although shielding a high proportion of incident light in a specific direction, the light-shielding films 121*b*-11 and 121*b*-12 cannot sufficiently shield light traveling from directions other than the specific direction. That is, incident light is optically modulated in accordance with the incident angle, and the change in proportion of light that can be shielded causes the detection value to change with change in the incident angle θ as illustrated in FIG. 7A. This makes it possible to provide each pixel output unit with a different incident angle directivity.

Also, similarly in a case where four photodiodes are provided in the single on-chip lens 121*c* as in the second configuration example of the imaging section, it is possible to provide each pixel output unit with a different incident angle directivity by varying, of the four photodiodes, those contributing to the pixel output from one pixel output unit to another.

It should be noted that although a case has been illustrated above where the imaging section 121 has on-chip lenses, it is possible to provide each pixel output unit with a different incident angle directivity by configuring the imaging section 121 as described above without using on-chip lenses.

<3. Other Configuration of Imaging Section>

Incidentally, the imaging section is not limited to a configuration for providing each pixel output unit with a different incident angle directivity by using light-shielding films that permit independent setup for each pixel output unit, changing the number of contributing photodiodes, or changing the intersecting point of the plurality of photodiodes. For example, the imaging section may employ a black-and-white pattern mask or a light interference mask as a device for providing different incident angle directivities.

Figure 8:
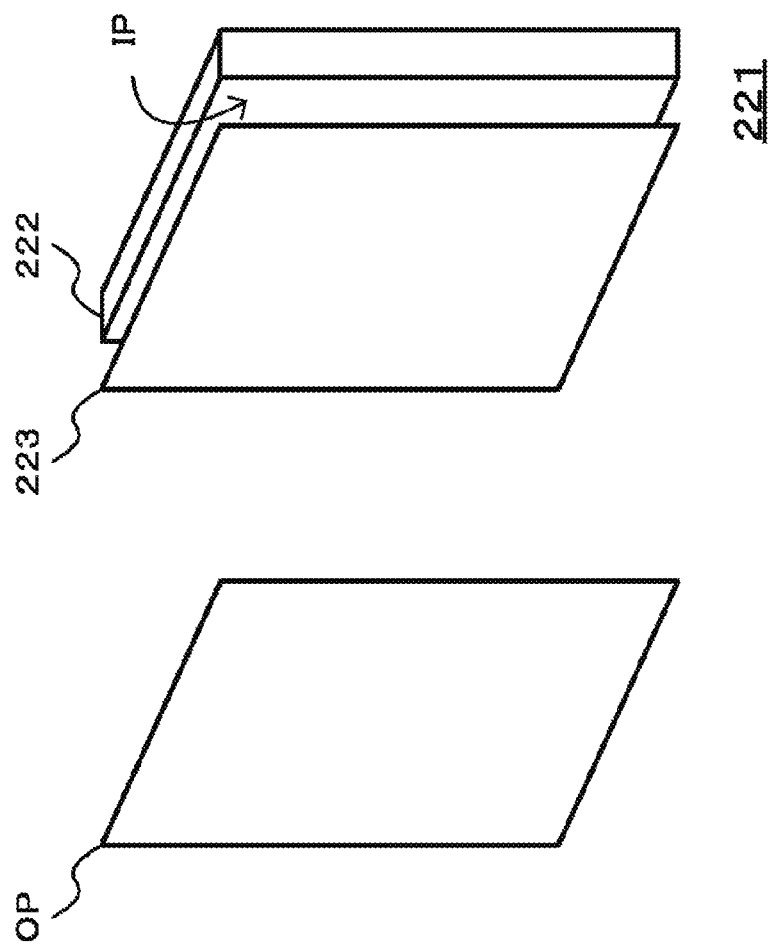
FIG. 8 illustrates a diagram illustrating another configuration of the imaging section.

FIG. 8 illustrates another configuration of the imaging section. An imaging section 221 has a mask 223, a modulating device, fastened to an imaging device 222 in such a manner that there is a given clearance to the imaging surface IP of the imaging device 222, thus allowing light from the subject plane OP to enter the imaging surface IP of the imaging device 222 via the mask 223.

FIGS. 9A, 9B, and 9C illustrate diagrams illustrating a case where a black-and-white pattern mask is used. FIG. 9A illustrates a black-and-white pattern mask. A black-and-white pattern mask 223BW includes white pattern portions for passing light and black pattern portions for shielding light that are arranged in a random manner, and the patterns are sized independently of the pixels of the imaging device 222. FIG. 9B schematically illustrates the manner in which light beams emitted from the point light source PA and light beams emitted from the point light source PB are illuminated on the imaging surface IP. Also, FIG. 9C individually and schematically illustrates a response of the imaging device in a case where the black-and-white pattern mask 223BW is used for each of the light beams emitted from the point light source PA and the point light source PB. The light beams from the subject plane OP enter the imaging surface IP of the imaging device 222 via the black-and-white pattern mask 223BW. This provides Sbwa as a response of the imaging device that handles the light beams emitted from the point light source PA of the subject plane OP. Therefore, this also provides Sbwb as a response of the imaging device that handles the light beams emitted from the point light source PB of the subject plane OP. Therefore, pixel output information output from the imaging device 222 is information of an image obtained by combining the responses of the respective light sources for each pixel output unit. In a case of this configuration, it is impossible to individually set an incident angle directivity for each pixel output unit, thus resulting in similar incident angle directivities for the pixel output units located close to each other.

FIGS. 10A, 10B, and 10C illustrate a case where a light interference mask is used. As illustrated in FIG. 10A, light beams emitted from the point light source PA and the point light source PB are illuminated on the imaging surface IP of the imaging device 222 via a light interference mask 223LF. Projections and recesses having a size of the order of the wavelength of light are provided, for example, on a light incident surface of the light interference mask 223LF as illustrated in FIG. 10B. Also, the light interference mask 223LF passes the largest amount of a specific wavelength of light when the light is illuminated perpendicularly. As the change in incident angle of a specific wavelength of light emitted from the point light sources PA and PB of the subject plane OP relative to the light interference mask 223LF (inclination relative to the perpendicular direction) increases, an optical path length changes. Here, when the optical path length is an odd number multiple of a half wavelength, the light beams weaken each other, and when the optical path length is an even number multiple of a half wavelength, the light beams strengthen each other. That is, the specific wavelength of light emitted from the point light sources PA and PB and that has passed through the light interference mask 223LF enters the imaging surface IP of the imaging device 222 at the intensity illustrated in FIG. 10C with an incident angle directivity proportional to the incident angle relative to the light interference mask 223LF. Therefore, pixel output information output from each output pixel unit of the imaging section 822 is information obtained by combining the light intensities of the respective point light sources that have passed through the light interference mask 223LF after the modulation. In a case of this configuration, it is impossible to individually set an incident angle directivity for each pixel output unit, thus resulting in similar incident angle directivities for the pixel output units located close to each other.

Figure 11:
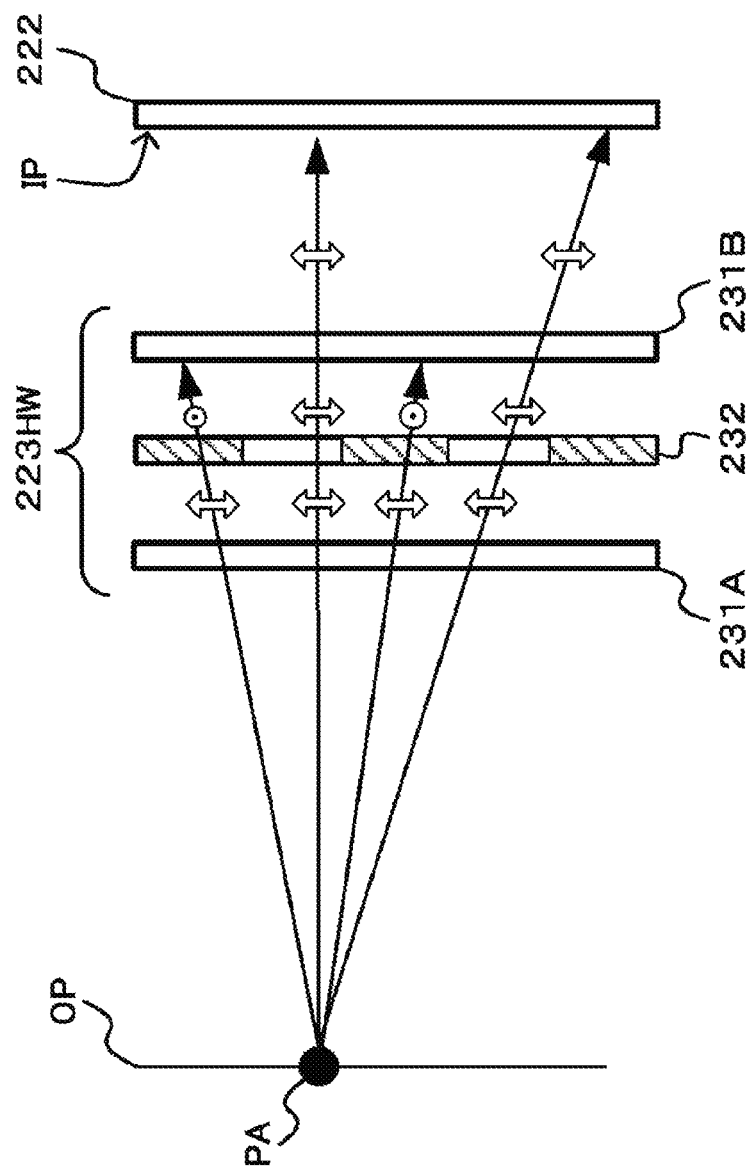
FIG. 11 illustrates a diagram illustrating a modification example of an imaging device.

It should be noted that an optical filter 223HW illustrated in FIG. 11 may be used in place of the optical filter 223BW. The optical filter 223HW includes a linear polarization device 231A, a linear polarization device 231B, and a λ/2 waveplate 232. The linear polarization device 231A and the linear polarization device 231B have the same polarization direction. The λ/2 waveplate 232 is sandwiched between the linear polarization device 231A and the linear polarization device 831B. The λ/2 waveplate 232 has polarization sections, depicted as shaded, in place of the black pattern portions of the black-and-white pattern mask 223BW so that the white pattern portions and the polarization sections are randomly arranged.

The linear polarization device 231A passes, of substantially non-polarized light emitted from the point light source PA, only light having a specific polarization direction. Hereinafter, we assume that the linear polarization device 231A passes light whose polarization direction is parallel to the drawing. Of polarized light that has passed through the linear polarization device 231A, polarized light that has passed through the polarization sections of the λ/2 waveplate 232 experiences a rotation of its polarization plane, thus causing its polarization direction to change to the vertical direction. On the other hand, of polarized light that has passed through the linear polarization device 231A, the polarization direction of polarized light that has passed through the white pattern portions of the λ/2 waveplate 232 remains unchanged and parallel to the drawing. Then, the linear polarization device 231B passes polarized light that has passed through the white pattern portions and hardly passes polarized light that has passed through the polarization sections. Therefore, polarized light that has passed through the polarization sections diminishes in quantity as compared to polarized light that has passed through the white pattern portions. This makes it possible to produce a shading pattern, nearly similar to a case where the optical filter 223BW is used, on a light-receiving surface (imaging surface) IP of the imaging device 222.

<4. Configuration and Operation of Information Processing Apparatus>

A description will be given next of a configuration of the information processing apparatus for processing pixel output information generated by an imaging apparatus having no imaging lens.

Figure 12:
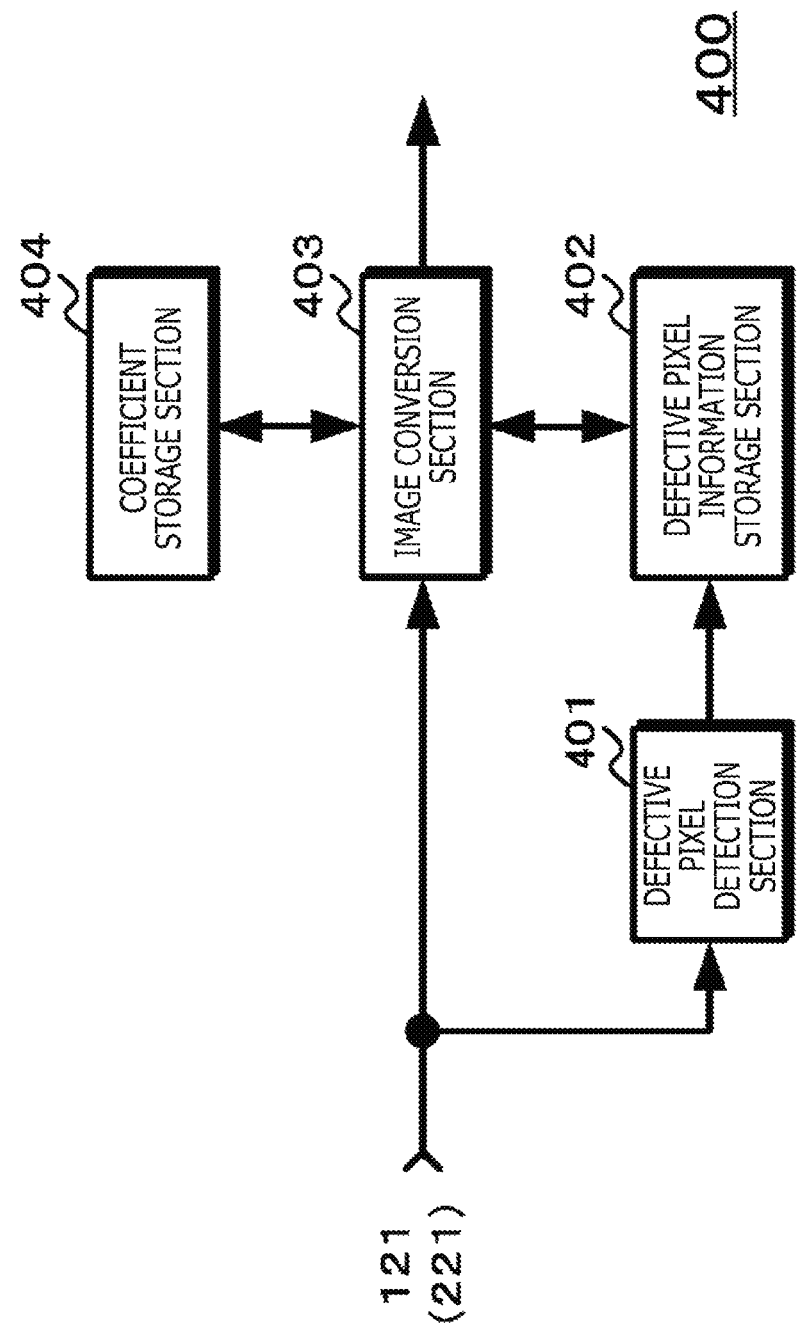
FIG. 12 illustrates a diagram illustrating a configuration of an information processing apparatus.

FIG. 12 illustrates a configuration of the information processing apparatus. An information processing apparatus 400 includes a defective pixel detection section 401, a defective pixel information storage section 402, an image conversion section 403, and a coefficient storage section 404.

The defective pixel detection section 401 detects a defective pixel output unit that has occurred in the imaging section 121 (221). There are two types of defective pixel outputs, one whose signal level is lower than a normal pixel output unit in a case where the same amount of light is incident (also referred to as a "dead pixel") and another whose signal level is higher than a normal pixel output unit in a case where the same amount of light is incident (also referred to as a "hot pixel"). Also, as described above, the imaging device has no imaging lens. As a result, it is obvious that the pixel outputs are relatively uniform in signal level across the screen. Therefore, a threshold range is set in advance in such a manner as to include relatively uniform signal levels. Alternatively, a threshold range is set on the basis of statistics of the pixel outputs. As for statistics of pixel output signal levels, a threshold range can be set without being affected by the defective pixel output unit as long as the statistics are calculated by excluding the pixel output generated by the detected defective pixel output unit. The defective pixel detection section 401 discriminates a pixel output unit whose signal level is higher than the upper limit of the threshold range as a hot pixel and discriminates a pixel output unit whose signal level is lower than the lower limit of the threshold range as a dead pixel. The defective pixel detection section 401 outputs the defect detection result to the image conversion section 403. It should be noted that defect detection may be conducted as with the imaging apparatus having an imaging lens such that a pixel output unit whose signal level is high during imaging in a light-shielded condition is discriminated as a hot pixel and that a pixel output unit whose signal level is lower than in other pixel output units, for example, during imaging of a uniformly bright white subject in a non-light-shielded condition is discriminated as a dead pixel.

The image conversion section 403 performs, on the basis of the defect detection results of the defective pixel detection section 401, restoration computations by using a coefficient of a normal pixel output unit from pixel output of a pixel output unit that is not a defective pixel output unit (hereinafter referred to as a "normal pixel output unit") and a coefficient set stored in the coefficient storage section 404, thus generating a pixel signal of a restored image. That is, pixel output information generated by the imaging section 121 (221) is, as described above, a pixel signal proportional to the incident angle directivity, making it invisible information that does not permit visual identification of the subject. Therefore, the image conversion section performs restoration computations by using a coefficient of a normal pixel output unit from pixel output of a pixel output unit that is not a defective pixel output unit and a coefficient set stored in the coefficient storage section 404, thus generating visible information, i.e., a captured image signal that permits visual identification of the subject.

A description will be given here of the relationship between light sources and pixel output. For example, in a case where the subject surface includes a point light source, light beams emitted from the same light source enter the imaging surface IP of the imaging section via a device for providing each light beam with a different characteristic. As a result, light having a different incident angle directivity (e.g., light whose intensity is proportional to the difference in incident angle or the mask) enters each pixel output unit of the imaging surface IP. That is, light beams identical in intensity are detected by different pixel output units with varying sensitivities, causing these light beams to be detected as different detection values. Here, in a case where the difference in incident angle directivity is represented by a coefficient, the detection value of each pixel output unit proportional to incident light can be found by multiplying the intensity of incident light by the coefficient proportional to the incident angle directivity.

Figure 13A:
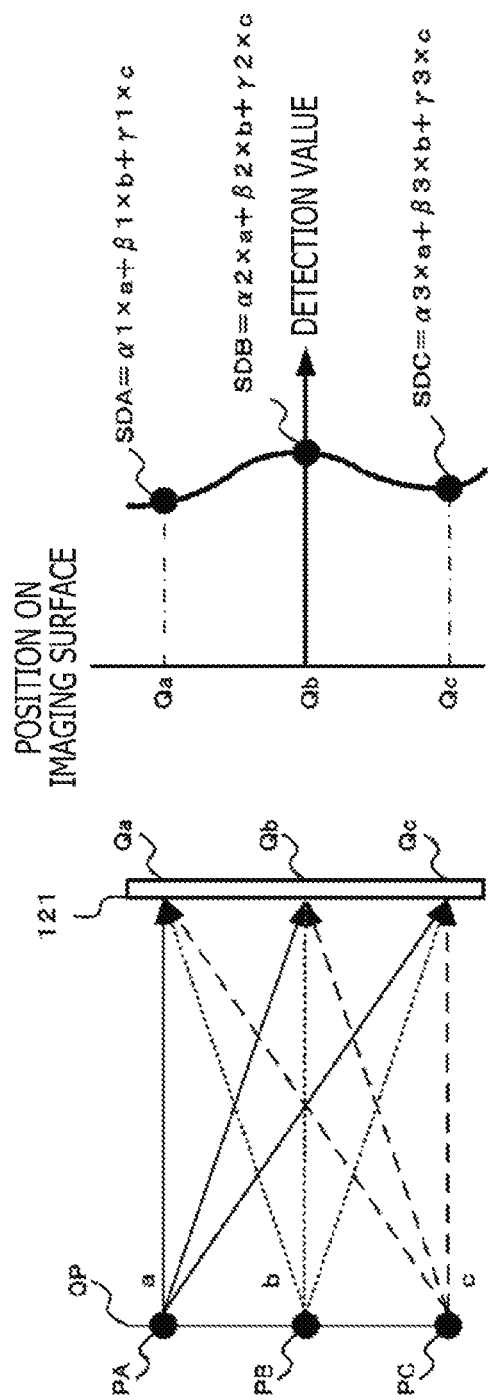
FIGS. 13A, 13B, and 13C illustrate diagrams for describing calculation of a detection value and a pixel value proportional to incident light in each pixel output unit.
Figure 13B:
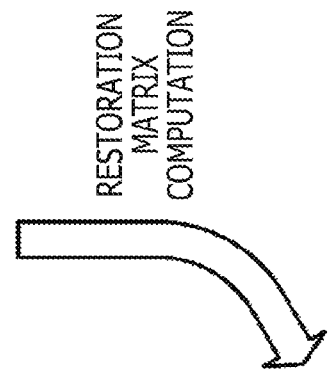
Figure 13C:
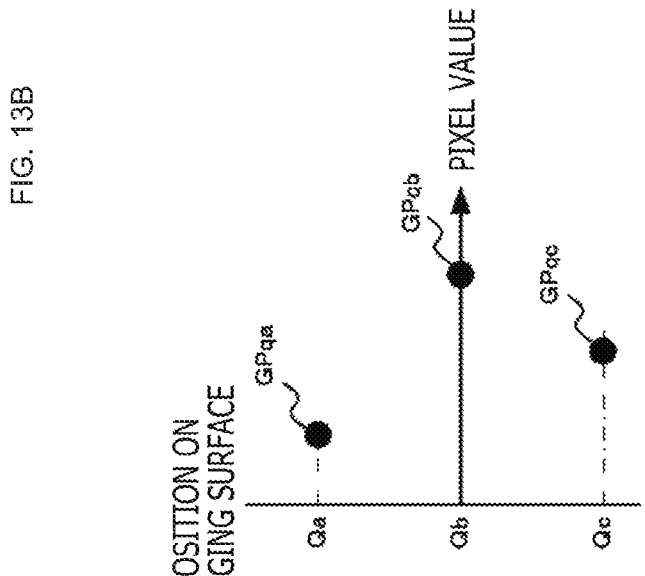

FIGS. 13A and 13B illustrate diagrams for describing calculation of a detection value and a pixel value in accordance with incident light in each pixel output unit. For example, as illustrated in FIG. 13A, the imaging section 121 captures images of the light sources PA, PB, and PC of the subject plane OP. FIG. 13B illustrates a relationship between positions on the imaging surface IP and detection values.

Here, detection values SDA, SDB, and SDC at positions Qa, Qb, and Qc are expressed by the following formulas (1) to (3), respectively:

$$SDA = \alpha1 \times a + \beta1 \times b + \gamma1 \times c \quad (1)$$

$$SDB = \alpha2 \times a + \beta2 \times b + \gamma2 \times c \quad (2)$$

$$SDC = \alpha3 \times a + \beta3 \times b + \gamma3 \times c \quad (3)$$

where α1 represents the incident angle directivity proportional to the incident angle of the light beam from the point light source PA at the position Qa of the imaging surface IP and is the coefficient for light intensity a.

Similarly, β1 represents the incident angle directivity proportional to the incident angle of the light beam from the point light source PB of the subject plane OP to be restored at the position Qa of the imaging surface IP and is the coefficient for light intensity b. γ1 represents the incident angle directivity proportional to the incident angle of the light beam from the point light source PC of the subject plane OP to be restored at the position Qa of the imaging surface IP and is the coefficient for light intensity c.

Therefore, (α1×a) in the detection value SDA represents the detection value produced by the light beam from the point light source PA at the position Qa and is obtained by multiplying the intensity a of the light beam from the point light source PA at the position Qa by the coefficient α1 that represents the incident angle directivity proportional to the incident angle.

Also, (β1×a) in the detection value SDA represents the detection value produced by the light beam from the point light source PB at the position Qa and is obtained by multiplying the intensity b of the light beam from the point light source PB at the position Qa by the coefficient β1 that represents the incident angle directivity proportional to the incident angle.

Further, (γ1×a) in the detection value SDA represents the detection value produced by the light beam from the point light source PC at the position Qa and is obtained by multiplying the intensity c of the light beam from the point light source PC at the position Qa by the coefficient γ1 that represents the incident angle directivity proportional to the incident angle.

Therefore, the detection value SDA is expressed as a sum of products of light intensities a, b, and c of the respective light beams from the point light sources PA, PB, and PC at the position Qa and the coefficients α1, β1, and γ1. It should be noted that a set of coefficients used to calculate a detection value such as α1, β1, and γ1 will be referred to as a coefficient set.

As for the detection value SDB at the position Qb, coefficient set "α2, β2, γ2" corresponds to a coefficient set "α1, β1, γ1" for the detection value SDA at the point light source PA. Also, as for the detection value SDC at the position Qc, a coefficient set "α3, β3, γ3" corresponds to the coefficient set "α1, β1, γ1" for the detection value SDA at the point light source PA.

Also, the detection values of the pixel output units at the positions Qa, Qb, and Qc are expressed by sums of products of the light intensities a, b, and c of the respective light beams emitted from the point light sources PA, PB, and PC and the coefficients. For this reason, these detection values are a mixture of the light intensities a, b, and c of the respective light beams emitted from the point light sources PA, PB, and PC, making these values different from those resulting from the formed image of the subject. Also, the detection values of the pixel output units at the positions Qa, Qb, and Qc are a mixture of the light intensities a, b, and c of the respective light beams emitted from the point light sources PA, PB, and PC. As a result, the difference in detection value between the pixel output units is smaller than in a case where an imaging lens is used, providing relatively uniform signal levels across the screen.

The detection values of the pixel output units at the positions Qa, Qb, and Qc are expressed by sums of products of the light intensities a, b, and c of the respective light beams emitted from the point light sources PA, PB, and PC and the coefficients as described above. Therefore, it is possible to find pixel values GPqa, GPqb, and GPqc at the respective positions Qa, Qb, and Qc as illustrated in (c) of FIG. 13B by establishing simultaneous equations using these coefficients α1, β1, γ1, α2, β2, γ2, α3, β3, and γ3 and the detection values SDA, SDB, and SDC and solving the equations with respect to the light intensities a, b, and c, that is, by performing restoration computations using the detection values and the coefficients. Also, this calculation is not limited to a case where the imaging section 121 is used. It is also possible to find the pixel values GPqa, GPqb, and GPqc at the respective positions Qa, Qb, and Qc in a case where the imaging section 221 is used by performing restoration computations using the detection values at the positions Qa, Qb, and Qc and the coefficients through a similar process. It should be noted that the coefficient sets "α1, β1, γ1," "α2, β2, γ2," and "α3, β3, γ3" used for the restoration computations will be referred to as a coefficient set group.

That is, the coefficients α1, β1, γ1, α2, β2, γ2, α3, β3, and γ3 are a coefficient set group for calculating light intensities of the point light sources on the subject surface from pixel outputs. By storing a coefficient set group for each subject distance in advance and performing restoration computations using the pixel outputs and the coefficient set group corresponding to a desired subject distance, it is possible to acquire a captured image depicting a visible subject with focus set at the desired subject distance even when the imaging section 121 (221) having no imaging lens is used.

Figure 14:
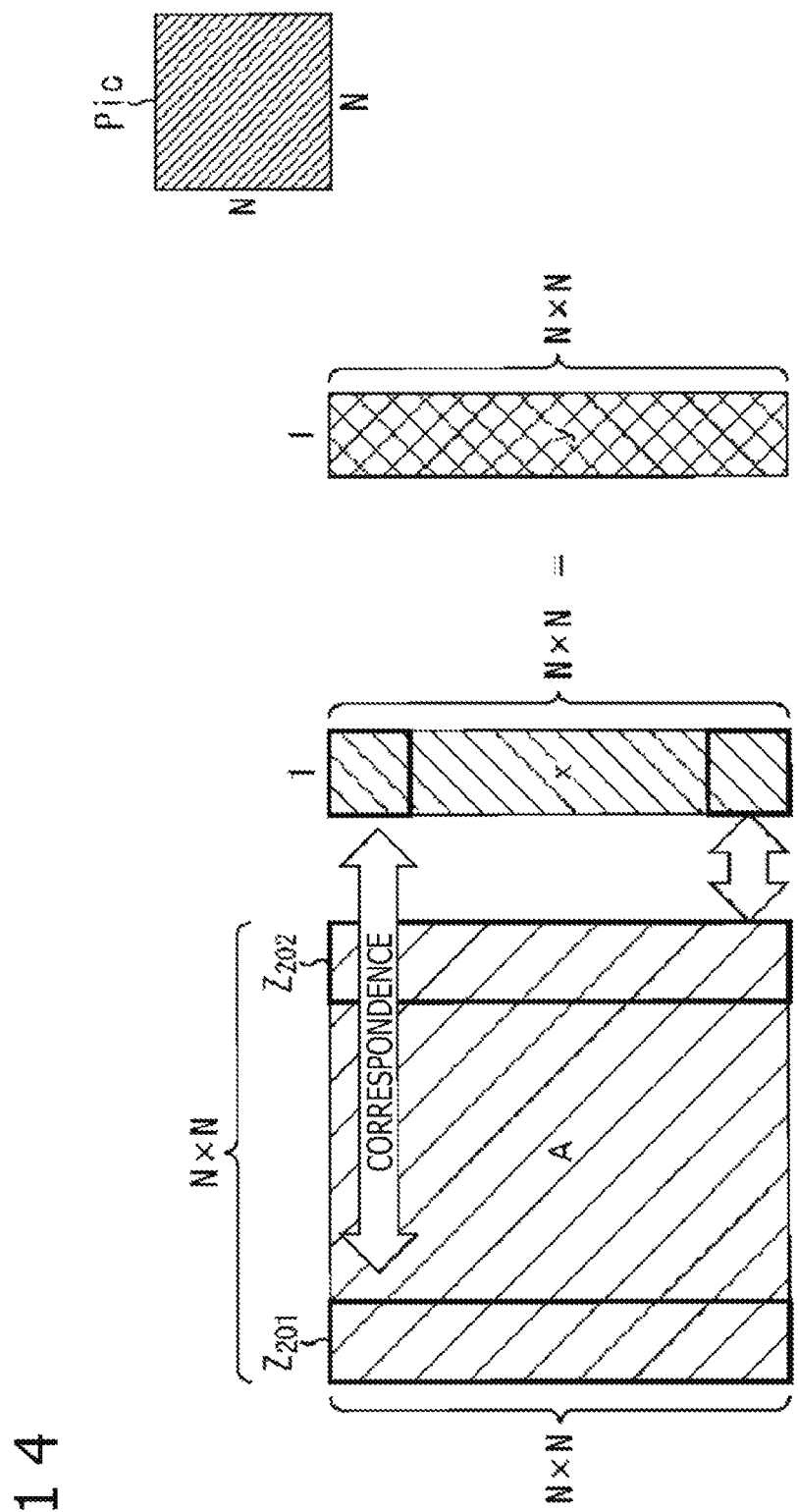
FIG. 14 illustrates a generalized relationship between light intensities of point light sources on a subject surface and detection values of the imaging section.
Figure 15:
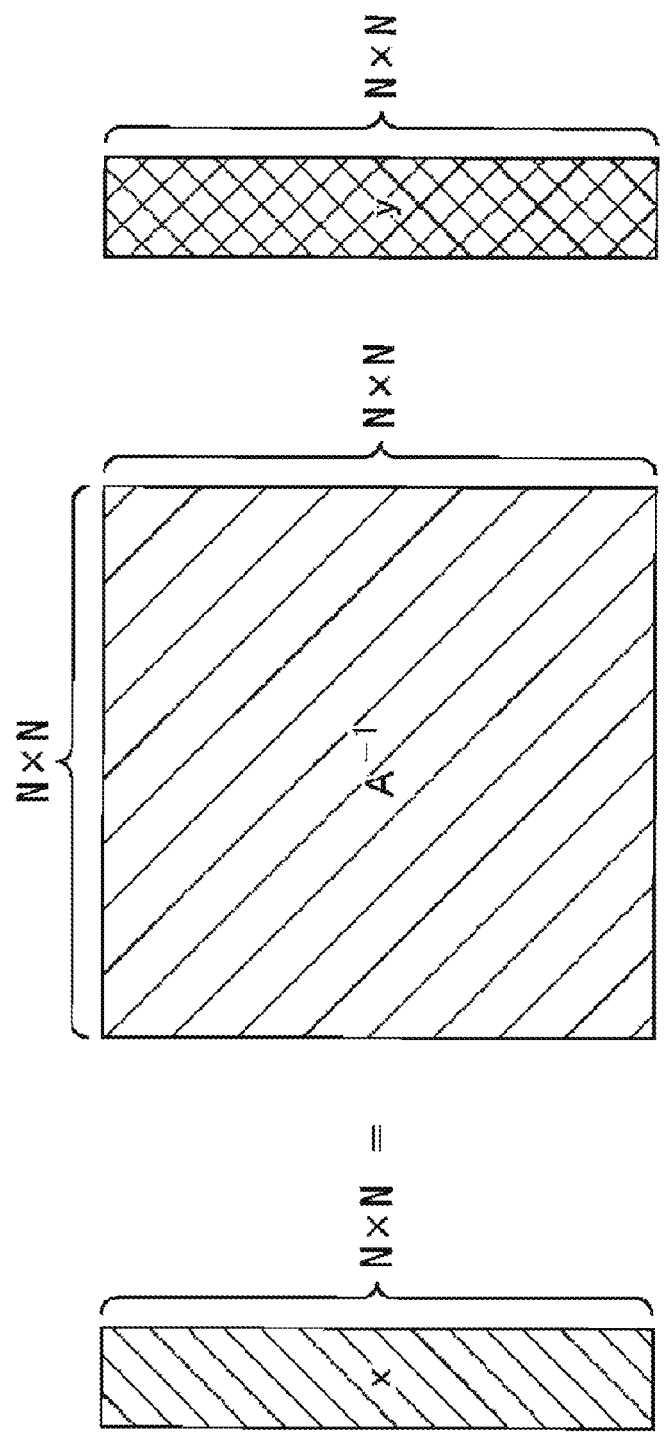
FIG. 15 illustrates a diagram illustrating a calculation formula for a vector x.

FIG. 14 illustrates a generalized relationship between light intensities of point light sources on the subject surface and detection values of the imaging section. We assume, for example, that the imaging section 121 (221) has N×N pixel output units with N×N point light sources on the subject plane OP. Here, letting the detection values of the N×N pixel output units be denoted as a one-dimensional vector y and the light intensities of the N×N point light sources be denoted as a vector x, the relationship illustrated in FIG. 14 holds by using a matrix A (also referred to as a "coefficient matrix A"), a coefficient set group having (N×N) rows×(N×N) columns.

For this reason, the image conversion section 403 performs restoration computations by using the coefficient set group stored in the coefficient storage section 404, thus generating the vector x representing the light intensity of the subject plane OP, i.e., an image signal representing a captured image of the subject plane OP.

Incidentally, the matrix formula illustrated in FIG. 14 is transformed into the calculation formula for the vector x by multiplying both sides by an inverse matrix $A^{-1}$ of the coefficient matrix A from the left. That is, it is possible to find each element of the vector x representing the light intensity of the subject plane OP by multiplying the vector y of the detection value by the inverse matrix $A^{-1}$ from the right.

However, there are cases in which simultaneous equations cannot be solved due, for example, to one or a combination of the reasons such as the practical coefficient matrix A cannot be found with accuracy, a basis vector of the coefficient matrix A is close to linear dependence, and noise is included in the detection value.

For this reason, a configuration robust to various types of errors is considered to estimate the vector x by using formula (4) based on the concept of a regularized least squares method.

[Math. 1]

$$\hat{x} = \min \|A\hat{x} - y\|^2 + \|\gamma \hat{x}\|^2 \quad (4)$$

In formula (4), the x with "^" on top denotes that it is an estimated value of the vector x. γ denotes a parameter. Also, "∥vector∥" denotes a norm (square root of sum of squares) of the vector. In formula (4), the first term is a norm when the difference between the two sides in FIG. 14 is minimized, and the second term is a regularization term.

The solution of this formula (4) with respect to the vector x is expressed by the following formula (5).

[Math. 2]

$$\hat{x} = (A^t A + \gamma I)^{-1} A^t y \quad (5)$$

Incidentally, in a case where the vector x is estimated by performing the above computation, the detection value of the defective pixel output unit is noise. Therefore, use of the defective pixel output unit leads to reduced accuracy of the vector x.

For this reason, the image conversion section 403 changes the coefficient set group on the basis of defective pixel information indicating the defective pixel position stored in the coefficient storage section 404, performing the above computation by using the changed coefficient set group and estimating the vector x.

As described above, the image conversion section 403 ensures that a captured image signal can be generated with high accuracy by performing restoration computations without using the pixel output of the defective pixel output unit.

Figure 16:
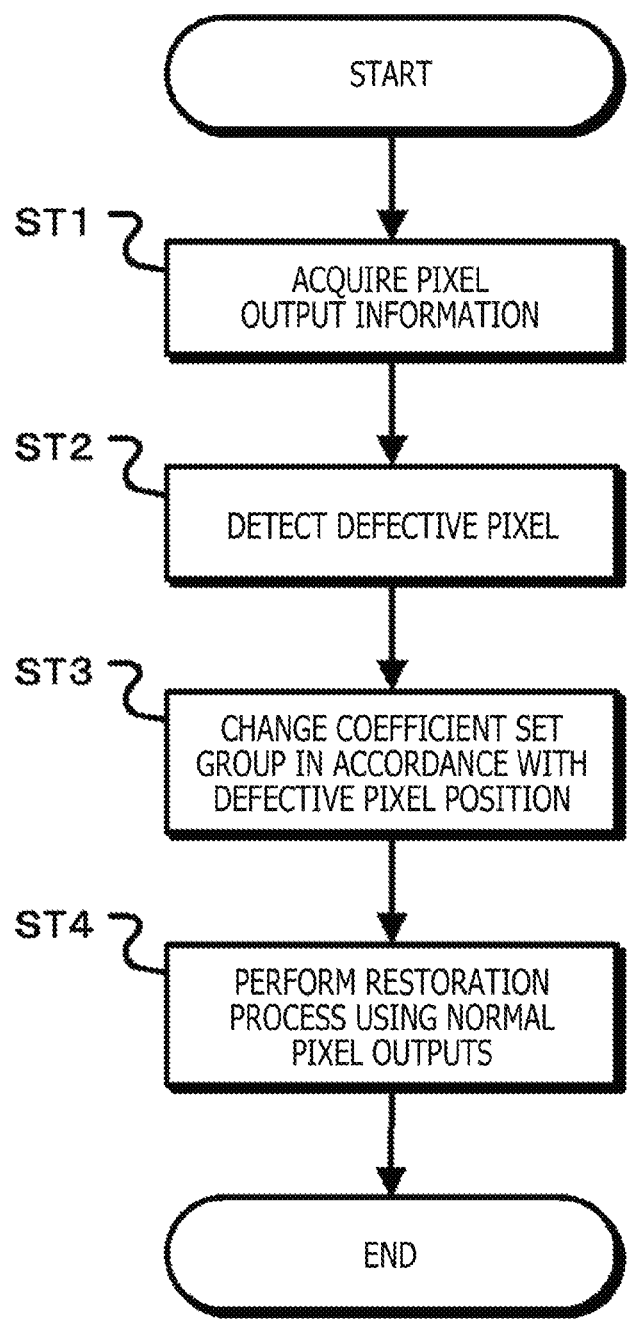
FIG. 16 illustrates a flowchart illustrating operation of the information processing apparatus.

FIG. 16 illustrates a flowchart illustrating operation of the information processing apparatus. In step ST1, the information processing apparatus acquires pixel output information. The information processing apparatus acquires pixel output information generated by the imaging section and proceeds to step ST2.

In step ST2, the information processing apparatus detects a defective pixel output unit. The information processing apparatus sets a threshold range in such a manner to include pixel outputs having relatively uniform levels and discriminates a pixel output unit whose pixel output is higher than the threshold range as a hot pixel. Also, the information processing apparatus discriminates a pixel output unit whose pixel output is lower than the threshold range as a dead pixel. The information processing apparatus discriminates the detected hot pixel and dead pixel as defective pixel output units and proceeds to step ST3.

In step ST3, the information processing apparatus changes the coefficient set group in accordance with the positions of the defective pixel output units. The information processing apparatus changes the coefficient set group in such a manner as to perform restoration computations without using the defective pixel output units detected in step ST2 and proceeds to step ST4.

In step ST4, the information processing apparatus performs the restoration computation by using the pixel outputs of the normal pixel output units. The information processing apparatus performs the restoration computation by using the pixel outputs of the normal pixel output units that have not been discriminated as defective pixel output units on the basis of the defective pixel detection results in step ST2 and the coefficient set group changed in step ST3 in accordance with the positions of the defective pixel output units, thus generating an image signal representing a restored image that, for example, permits visual recognition of a subject.

<5. Configuration and Operation of Imaging Apparatus>

Figure 17:
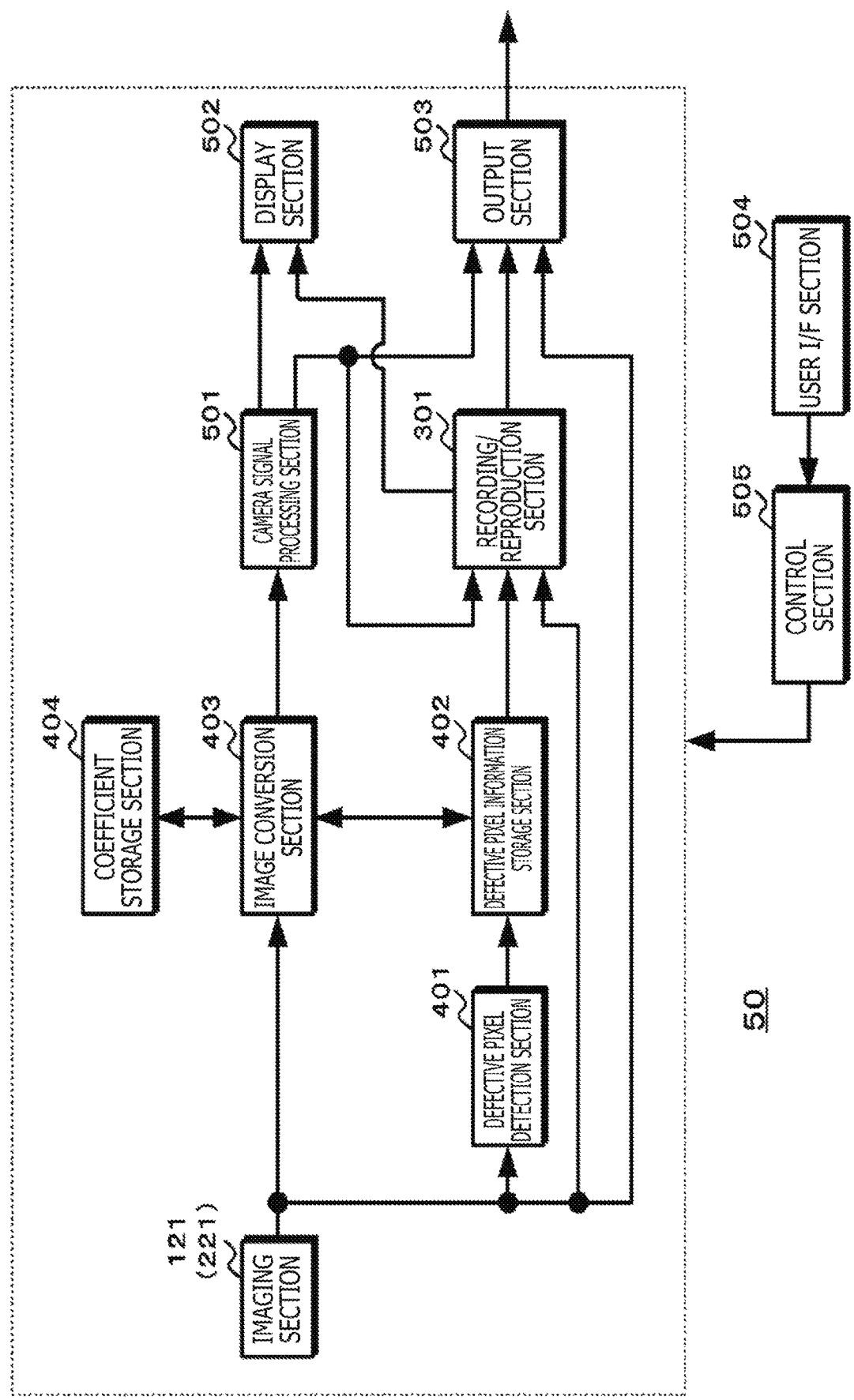
FIG. 17 illustrates a diagram illustrating a configuration of an imaging apparatus.

A description will be given next of the configuration and operation of the imaging apparatus using the information processing apparatus. FIG. 17 illustrates a configuration of the imaging apparatus.

An imaging apparatus 50 includes an imaging section 121 (221), a recording/reproduction section 301, a defective pixel detection section 401, a defective pixel information storage section 402, an image conversion section 403, a coefficient storage section 404, a camera signal processing section 501, a display section 502, an output section 503, a user interface (I/F) section 504, and a control section 505.

The imaging section 121 (221) generates pixel output information having an incident angle directivity and outputs the information to the recording/reproduction section 301, the defective pixel detection section 401, and the output section 503. Also, the imaging section 121 (221) controls, for example, imaging operation on the basis of a control signal from the control section 505.

The recording/reproduction section 301 records, to a recording medium, pixel output information generated by the imaging section 121 (221) and a pixel signal processed by the camera signal processing section 501. Also, the recording/reproduction section 301 reads out pixel output information recorded in the recording medium and outputs the information to the defective pixel detection section 401 or the output section 503. It should be noted that the recording medium may be detachable or be fastened to the recording/reproduction section 301. Also, the recording/reproduction section 301 may associate defective pixel information stored in the defective pixel information storage section 402 with pixel output information generated by the imaging section 121 (221). For example, the recording/reproduction section 301 associates defective pixel information with pixel output information by recording defective pixel information as metadata of pixel output information. As described above, the association of defective pixel information with pixel output information allows for image conversion, a process for generating a captured image signal from pixel output information, to be performed as an offline process. Also, the recording/reproduction section 301 may record, to a recording medium, an image signal, processed by the camera signal processing section 501 which will be described later. Further, the recording/reproduction section 301 may read out a pixel signal recorded in a recording medium and outputs the signal to the display section 502 or the output section 503.

The defective pixel detection section 401 detects defective pixel output units of the imaging device of the imaging section 121 (221). Defective pixel output units are discriminated as such by setting a threshold range in such a manner to include pixel outputs having relatively uniform levels and by discriminating a pixel output unit whose pixel output is higher than the upper limit of the threshold range and a pixel output unit whose pixel output is lower than the lower limit of the threshold range. The defective pixel detection section 401 outputs defect detection results to the defective pixel information storage section 402.

The defective pixel information storage section 402 stores defective pixel information indicating the positions of the defective pixel output units of the imaging section 121 (221) and updates defective pixel information on the basis of the defect detection results of the defective pixel detection section 401.

The image conversion section 403 acquires a coefficient set group from the coefficient storage section 404 on the basis of the defective pixel information stored in the defective pixel information storage section 402 and performs restoration computations by using pixel outputs of the normal pixel output units in the pixel output information supplied from the imaging section 121 (221) and the acquired coefficient set group, thus generating a restored image signal. The image conversion section 403 outputs the generated restored image signal to the camera signal processing section 501. It should be noted that in a case where the imaging device has a sensitivity range that includes the visible range, the restored image permits visual recognition of a subject.

The coefficient storage section 404 stores, in advance, coefficient set groups used to perform computations for restoring an image signal representing a captured image from pixel output information.

The camera signal processing section 501 generates an image signal for each color component in a case where a color sensor is used as the imaging section 121 (221) that includes pixel output units, one for each color components. Also, the camera signal processing section 501 performs gamma correction, white balance adjustment, and other processes. The camera signal processing section 501 outputs the processed image signal to the recording/reproduction section 301, the display section 502, and the output section 503.

The display section 502 includes a liquid crystal display device, an organic EL display device, or other type of device and displays an image or other information representing a subject whose image has been captured by the imaging section 121 (221) on the basis of an image signal output from the camera signal processing section 501 or an image signal read out from the recording medium by the recording/reproduction section 301. Also, the display section 502 may display menu items of the imaging apparatus 50, settings, and operating status thereof.

The output section 503 selects one of pixel output information generated by the imaging section 121 (221), the image signal output from the camera signal processing section 501, pixel output information and defective pixel information read out from the recording medium by the recording/reproduction section 301 and outputs the selected piece of information to external equipment. It should be noted that in a case where an image signal is output, the output section 503 may compress the image signal in a given compression format such as JPEG (Joint Photographic Experts Group) or GIF (Graphics Interchange Format) before outputting the image signal.

The user interface (I/F) section 504 includes manipulation buttons, manipulation switches, and so on, generating a manipulation signal responsive to the user's manipulation and outputting the signal to the control section 505.

The control section 505 may control each section such that the imaging apparatus 50 functions in response to the user's manipulation on the basis of a control signal from the user interface section 504. For example, the control section 505 controls each section such that the image conversion section 403 selects, from the coefficient sets stored in the coefficient storage section 404, the coefficient set corresponding to the subject distance specified by the user and that the image formed at the subject distance is displayed on the display section 502. Also, a so-called autofocus function can be realized by adjusting the subject distance in such a manner as to achieve the maximum contrast of a desired subject in the image signal generated by the image conversion section 403.

The detection of defects may be carried out in the manufacturing process or before shipment following the manufacture so that information indicating the detected defective pixel output units is stored in the defective pixel information storage section 402 in advance. The detection of defects in the manufacturing process may be carried out by using a testing apparatus. Also, the detection of defects before shipment following the manufacture, i.e., step ST2 in FIG. 16, may be carried out at the time of startup after power-on ahead of shooting involving a still or video recording action or at the time of a live view action.

It should be noted that although a description has been given, in the present embodiment, of a case where a restored image is a visible light image, a restored image is not limited to a visible light image and may be an infrared image acquired by using an imaging device whose sensitivity range lies in the infrared range or other image. Also, although a description has been given, in the present embodiment, of a case where the imaging device is an area sensor, the imaging device may be a line sensor. Also, the imaging apparatus of the present technology is capable of acquiring an image signal of a subject image without using an imaging lens, thus making the imaging apparatus applicable not only as a standalone camera used to capture an image of a human or a landscape but also to a location with a restricted space for installation and to fields requiring downsizing of the imaging apparatus. For example, when used as a monitoring camera or a vehicle-mounted camera, the imaging apparatus can be installed where space is restricted and, therefore, provides an enhanced degree of freedom in installation and other factors. Also, when used as a medical camera such as endoscope, the imaging apparatus can readily achieve downsizing of a medical camera.

The series of processes described in the specification can be performed by hardware, software, or a combination thereof. In a case where the processes are performed by software, a program recording a processing sequence is installed to a memory of a computer incorporated in dedicated hardware for execution. Alternatively, the program can be installed to a general-purpose computer capable of performing various processes.

For example, the program can be recorded in advance to a hard disc, an SSD (Solid State Drive), or a ROM (Read Only Memory). Alternatively, the program can be stored (recorded) temporarily or permanently in a removable recording medium such as a flexible disc, CD-ROM (Compact Disc Read Only Memory), an MO (Magneto optical) disc, a DVD (Digital Versatile Disc), a BD (Blu-Ray Disc (registered trademark)), a magnetic disc, or a semiconductor memory card. Such a removable recording medium can be provided as so-called package software.

Also, the program can be not only installed to the computer from a removable recording medium but also transported, in a wireless or wired manner, from a download site to the computer via a network such as LAN (Local Area Network) or the Internet. The computer can receive a program transported in such a manner and install the program to a recording medium such as its built-in hard disc.

It should be noted that the effect recited in the present specification is merely illustrative and not restrictive and that there may be additional effects not recited in the specification. Also, the present technology should not be interpreted as limited to the embodiment of the technology described above. This embodiment of the technology discloses the present technology by way of illustration, and it is apparent that a person skilled in the art can modify or replace the embodiment without departing from the gist of the present technology. That is, the claims should be considered to understand the gist of the present technology.

Also, the information processing apparatus of the present technology can also have the following configurations.

(1)

An information processing apparatus including:

an image conversion section adapted to generate a restored image by using pixel outputs other than that of a defective pixel output unit, the pixel outputs being produced by an imaging device that includes a plurality of pixel output units that receive subject light that enters without going through an imaging lens and a pinhole, the pixel outputs of at least two of the plurality of pixel output units differing in incident angle directivity as a result of modulation of the incident angle directivity in accordance with the incident angle of the subject light.

(2)

The information processing apparatus according to (1), in which the image conversion section generates the restored image through restoration computations by using the pixel outputs.

(3)

The information processing apparatus according to (2), in which the image conversion section generates the restored image by solving simultaneous equations using the pixel outputs of the plurality of pixel output units other than that of the defective pixel output unit and coefficient set groups, each corresponding to one of the pixel output units other than that of the defective pixel output unit.

(4)

The information processing apparatus according to (3), in which the image conversion section changes the coefficient set group in accordance with a position of the defective pixel output unit.

(5)

The information processing apparatus according to any one of (1) to (4), further including:

a defective pixel detection section adapted to detect the defective pixel output unit by using the pixel outputs generated by the respective pixels of the imaging device.

(6)

The information processing apparatus according to (5), in which the defective pixel detection section discriminates, as a defective pixel output unit, a pixel output unit that has produced a pixel output whose signal level is larger than an upper limit of a threshold range or smaller than a lower limit of the threshold range.

(7)

The information processing apparatus according to (6), in which the threshold range is set on the basis of statistics of pixel output signal levels of the pixel outputs.

(8)

The information processing apparatus according to (7), in which the threshold range is set on the basis of the statistics other than that of the pixel output generated by the defective pixel output unit that has already been detected.

(9)

The information processing apparatus of any one according to (1) to (8), in which the restored image includes an image that permits visual recognition of a subject.

(10)

The information processing apparatus according to any one of (1) to (9), in which each of the plurality of pixel output units includes a photodiode, at least the two pixel output units each have a light-shielding film for shielding subject light from entering the photodiode, and a zone over which subject light is shielded by the light-shielding film is different between at least the two pixel output units.

(11)

The information processing apparatus according to any one of (1) to (9), in which each of the plurality of pixel output units includes a plurality of photodiodes, and at least the two pixel output units differ in incidence position of incident light from the subject for the plurality of photodiodes.

(12)

The information processing apparatus according to any one of (1) to (11), in which an incidence directivity relative to the subject light can be independently set for each of the plurality of pixel output units.

INDUSTRIAL APPLICABILITY

The information processing apparatus, the information processing method, the imaging apparatus, and the program of the present technology generate a restored image by using pixel outputs other than that of a defective pixel output unit. The pixel outputs are produced by an imaging device that includes the plurality of pixel output units that receive subject light that enters without going through an imaging lens and a pinhole. The pixel outputs of at least two of the plurality of pixel output units differ in incident angle directivity as a result of modulation of the incident angle directivity in accordance with the incident angle of the subject light. This makes it possible to restore a captured image with high accuracy on the basis of the subject light that enters without going through the imaging lens or the pinhole, thus making the present technology applicable to a location with a confined space for installing an imaging apparatus or to fields requiring downsizing of the imaging apparatus.

REFERENCE SIGNS LIST 121, 221 . . . Imaging section
222 . . . Imaging device
223 . . . Mask
223BW . . . Black-and-white pattern mask
223HW . . . Optical filter
223LF . . . Light interference mask
231A, 231B . . . Linear polarization device
232 . . . λ/2 waveplate
301 . . . Recording/reproduction section
400 . . . Information processing apparatus
401 . . . Defective pixel detection section
402 . . . Defective pixel information storage section
403 . . . Image conversion section
404 . . . Coefficient storage section
501 . . . Camera signal processing section 502 . . . Display section
503 . . . Output section
504 . . . User interface (I/F) section
505 . . . Control section

The invention claimed is:

1. An information processing apparatus, comprising:
   circuitry configured to:
   receive a plurality of pixel outputs from an imaging device, wherein the imaging device includes a plurality of pixel output units configured to receive subject light that enters without passing through an imaging lens and a pinhole; and
   generate a restored image based on the plurality of pixel outputs other than a pixel output of a defective pixel output unit of the plurality of pixel output units, wherein
      the imaging device is configured to output the plurality of pixel outputs based on the received subject light,
      each pixel output unit of the plurality of pixel output units includes a photodiode,
      each pixel output unit of the plurality of pixel output units includes a light-shielding film to shield the subject light that enters the photodiode,
      a zone over which the subject light is shielded by the light-shielding film is different between at least two pixel output units of the plurality of pixel output units, such that an incident angle directivity with respect to the subject light is set independently for each of the at least two pixel output units, and
      pixel outputs of the at least two pixel output units of the plurality of pixel output units differ in the incident angle directivity as a result of modulation of the incident angle directivity in accordance with an incident angle of the subject light.

2. The information processing apparatus according to claim 1, wherein the circuitry is further configured to:
   execute a restoration computation based on the plurality of pixel outputs; and
   generate the restored image based on the execution of the restoration computation.

3. The information processing apparatus according to claim 2, wherein the circuitry is further configured to:
   store a plurality of coefficient sets;
   determine a coefficient set of the plurality of coefficient sets corresponding to the plurality of pixel outputs other than the pixel output of the defective pixel output unit;
   solve a plurality of simultaneous equations based on the plurality of pixel outputs and the determined coefficient set; and
   generate the restored image based on the solved plurality of simultaneous equations.

4. The information processing apparatus according to claim 3, wherein the circuitry is further configured to:
   determine defective pixel information based on the pixel output of the defective pixel output unit, wherein the defective pixel information includes information related to a position of the defective pixel output unit; and
   determine the coefficient set based on the defective pixel information.

5. The information processing apparatus according to claim 1, wherein the circuitry is further configured to detect the pixel output of the defective pixel output unit based on the plurality of pixel outputs.

6. The information processing apparatus according to claim 5, wherein the circuitry is further configured to determine the defective pixel output unit based on a signal level of the defective pixel output unit that is one of larger than an upper limit of a threshold range or smaller than a lower limit of the threshold range.

7. The information processing apparatus according to claim 6, wherein the circuitry is further configured to set the threshold range based on first statistics associated with signal levels of the plurality of pixel outputs.

8. The information processing apparatus according to claim 7, wherein the circuitry is further configured to:
   store information related to a previously detected defective pixel output unit;
   exclude the signal level of the previously detected defective pixel output unit based on the stored information; and
   set the threshold range based on second statistics of a signal level of each of the plurality of pixel outputs other than that of the pixel output generated by the previously detected defective pixel output unit.

9. The information processing apparatus according to claim 1, wherein the restored image includes information for visual recognition of a subject.

10. The information processing apparatus according to claim 1, wherein
    the light-shielding film shields a first zone of a first output pixel unit of the at least two pixel output units,
    the light-shielding film shields a second zone of a second output pixel unit of the at least two pixel output units, and
    the first zone is different from the second zone.

11. An information processing method, comprising:
    receiving a plurality of pixel outputs from an imaging device, wherein the imaging device includes a plurality of pixel output units configured to receive subject light that enters without passing through an imaging lens and a pinhole; and
    generating a restored image based on the plurality of pixel outputs other than a pixel output of a defective pixel output unit of the plurality of pixel output units, wherein
       the imaging device is configured to output the plurality of pixel outputs based on the received subject light,
       each pixel output unit of the plurality of pixel output units includes a photodiode,
       each pixel output unit of the plurality of pixel output units includes a light-shielding film to shield the subject light that enters the photodiode,
       a zone over which the subject light is shielded by the light-shielding film is different between at least two pixel output units of the plurality of pixel output units, such that an incident angle directivity with respect to the subject light is set independently for each of the at least two pixel output units, and
       pixel outputs of the at least two pixel output units of the plurality of pixel output units differ in the incident angle directivity as a result of modulation of the incident angle directivity in accordance with an incident angle of the subject light.

12. An imaging apparatus, comprising:
    a plurality of pixel output units configured to receive subject light that enters without passing through an imaging lens and a pinhole, wherein
       the plurality of pixel output units is configured to output a plurality of pixel outputs based on the received subject light, each pixel output unit of the plurality of pixel output units includes a photodiode, each pixel output unit of the plurality of pixel output units includes a light-shielding film to shield the subject light that enters the photodiode, a zone over which the subject light is shielded by the light-shielding film is different between at least two pixel output units of the plurality of pixel output units, such that an incident angle directivity with respect to the subject light is set independently for each of the at least two pixel output units, and pixel outputs of at least two pixel output units of the plurality of pixel output units differ in the incident angle directivity as a result of modulation of the incident angle directivity in accordance with an incident angle of the subject light; and circuitry configured to:
store defective pixel information that indicates a defective pixel output unit of the plurality of pixel output units; and generate a restored image using the plurality of pixel outputs other than a pixel output of the defective pixel output unit based on the defective pixel information.

13. The imaging apparatus according to claim 12, wherein the circuitry is further configured to:

store a plurality of coefficient sets;

determine a coefficient set of the plurality of coefficients sets that corresponds to one of the plurality of pixel outputs;

solve a plurality of simultaneous equations based on the plurality of pixel outputs other than the pixel output of the defective pixel output unit and the determined coefficient set; and generate the restored image based on the solved plurality of simultaneous equations.

14. The imaging apparatus according to claim 13, wherein the stored defective pixel information indicates a position of the defective pixel output unit, and the circuitry is further configured to determine the coefficient set of the plurality of coefficient sets based on the stored defective pixel information.

15. The imaging apparatus according to claim 12, wherein the circuitry is further configured to:

detect the defective pixel output unit based on the plurality of pixel outputs; and update the stored defective pixel information based on a result of the detection of the defective output pixel unit.

16. The imaging apparatus according to claim 15, wherein the circuitry is further configured to determine the defective pixel output unit based on a signal level of the defective pixel output unit that is one of larger than an upper limit of a threshold range or smaller than a lower limit of the threshold range.

17. The imaging apparatus according to claim 16, wherein the circuitry is further configured to:

set the threshold range based on a plurality of signal levels of the plurality of pixel outputs; and detect the defective pixel output unit based on the set threshold range, wherein the plurality of pixel outputs is output during live view operation.

18. A non-transitory computer-readable medium having stored thereon, computer-executable instructions which, when executed by a processor, cause the processor to execute operations, the operations comprising:

receiving a plurality of pixel outputs from an imaging device, wherein the imaging device includes a plurality of pixel output units configured to receive subject light that enters without passing through an imaging lens and a pinhole; and generating a restored image based on the plurality of pixel outputs other than a pixel output of a defective pixel output unit of the plurality of pixel output units, wherein the imaging device is configured to output the plurality of pixel outputs based on the received subject light, each pixel output unit of the plurality of pixel output units includes a photodiode, each pixel output unit of the plurality of pixel output units includes a light-shielding film to shield the subject light that enters the photodiode, a zone over which the subject light is shielded by the light-shielding film is different between at least two pixel output units of the plurality of pixel output units, such that an incident angle directivity with respect to the subject light is set independently for each of the at least two pixel output units, and pixel outputs of the at least two pixel output units of the plurality of pixel output units differ in the incident angle directivity as a result of modulation of the incident angle directivity in accordance with an incident angle of the subject light.

* * * * *